US008432302B2

(12) United States Patent
Feng et al.

(10) Patent No.: US 8,432,302 B2
(45) Date of Patent: Apr. 30, 2013

(54) METHOD AND APPARATUS FOR LINE CODING

(75) Inventors: Dongning Feng, Shenzhen (CN); Weiguang Liang, Shenzhen (CN); Dongyu Geng, Shenzhen (CN); Jing Li, Shenzhen (CN); Frank Effenberger, Colts Neck, NJ (US); Sergio Benedetto, Turin (IT); Guido Montorsi, Turin (IT)

(73) Assignee: Huawei Technologies Co., Ltd., Shenzhen (CN)

(*) Notice: Subject to any disclaimer, the term of this patent is extended or adjusted under 35 U.S.C. 154(b) by 201 days.

(21) Appl. No.: 12/981,739

(22) Filed: Dec. 30, 2010

(65) Prior Publication Data

US 2011/0181450 A1    Jul. 28, 2011

Related U.S. Application Data

(63) Continuation of application No. PCT/CN2009/071900, filed on May 21, 2009.

(51) Int. Cl.
*H03M 5/00* (2006.01)

(52) U.S. Cl.
USPC ............ 341/58; 341/50; 341/51; 341/67; 341/65; 341/61; 341/101; 341/59; 341/106; 341/102

(58) Field of Classification Search ........ 341/58, 341/59, 61, 106, 102, 50, 51, 67, 65, 101
See application file for complete search history.

(56) References Cited

U.S. PATENT DOCUMENTS

| | | | | |
|---|---|---|---|---|
| 4,486,739 A | * | 12/1984 | Franaszek et al. | 341/59 |
| 5,144,304 A | * | 9/1992 | McMahon et al. | 341/58 |
| 5,740,186 A | * | 4/1998 | Widmer | 714/753 |
| 6,081,210 A | * | 6/2000 | Nikolic et al. | 341/59 |
| 6,198,413 B1 | * | 3/2001 | Widmer | 341/59 |
| 6,225,924 B1 | * | 5/2001 | Epshtein et al. | 341/106 |
| 6,310,923 B1 | | 10/2001 | Lee et al. | |
| 6,425,107 B1 | | 7/2002 | Caldara et al. | |
| 6,614,369 B1 | | 9/2003 | Widmer | |
| 6,747,580 B1 | | 6/2004 | Schmidt | |
| 7,405,679 B1 | | 7/2008 | Widmer | |
| 2008/0143347 A1 | | 6/2008 | Casey et al. | |
| 2008/0267634 A1 | | 10/2008 | Effenberger | |

FOREIGN PATENT DOCUMENTS

| | | |
|---|---|---|
| CN | 1273712 A | 11/2000 |
| JP | 2-94923 A | 4/1990 |

OTHER PUBLICATIONS

IEEE Standards, "IEEE Standard for Information technology—Telecommunications and information exchange between systems—Local and metropolitan area networks—Specific Requirements, Part 3: Carrier Sense Multiple Access with Collision Detection (CSMA/CD) Access Method and Physical Layer Specifications, Amendment: Media Access Control (MAC) Parameters, Physical Layers, and Management Parameters for 10 Gb/s Operation", IEEE Std 802.3ae, pp. i-xi and 1-516.

(Continued)

*Primary Examiner* — Jean B Jeanglaude
(74) *Attorney, Agent, or Firm* — Conley Rose, P.C.; Grant Rodolph; Nicholas K. Beaulieu

(57) ABSTRACT

The present invention provides a convolutional line coding method, including: constructing a sequence set, where the length of each sequence in the sequence set is n bits; selecting a balanced sequence in the sequence set, and obtaining source data of n−1 bits corresponding to the balanced sequence; performing Hamming distance detection for an unbalanced sequence in the sequence set to obtain source data of n−1 bits corresponding to the unbalanced sequence; sorting the balanced sequence and the unbalanced sequence according to an operation difference value, and generating a code table, where the source data of n−1 bits correspond to the sequence of n bits, and the code table is designed for line coding; and at time of encoding the source data of n−1 bits, obtaining a coding result of n bits according to a mapping relation in the code table.

13 Claims, 2 Drawing Sheets

OTHER PUBLICATIONS

International Search Report from P.R. China in International Application No. PCT/CN2009/071900 mailed Feb. 11, 2010.
EPO Extended European Search Report dated Jul. 26, 2012, issued in related European Application No. 09844785.7, Huawei Technologies Co., Ltd. (8 pages).
PCT International Search Report mailed Feb. 11, 2010, issued in related International Application No. PCT/CN2009/071900, Huawei Technologies Co., Ltd. (4 pages).
PCT Written Opinion of the International Searching Authority mailed Feb. 11, 2010, issued in related International Application No. PCT/CN2009/071900, Huawei Technologies Co., Ltd. (3 pages).
Effenberger et al., "A 9b10b Line Code for 2.5Gb/s Upstream PONs", Optical Society of America, OSA/OFC/NFOEC, 2009 (3 pages).

* cited by examiner

METHOD AND APPARATUS FOR LINE CODING

CROSS-REFERENCE TO RELATED APPLICATION

This application is a continuation of International Application No. PCT/CN2009/071900, filed on May 21, 2009, which is hereby incorporated by reference in its entirety.

FIELD OF THE INVENTION

The present invention relates to communication technologies, and in particular, to a method and an apparatus for line coding.

BACKGROUND

Line coding is widely applied in the Ethernet system. Line coding is designed to enable the point-to-point system to use cost-effective optical receiver. Due to Direct Current (DC) balance and the small number of DC components of line coding, the line coding is more suitable for the Ethernet Passive Optical Network (EPON) system. Common line coding modes include: 9B10B line coding, 8B10B line coding, 64B/66B line coding, and 64B/65B line coding. The 8B10B coding efficiency is not high, and involves 20% redundancy. Neither the 64B/66B line coding nor the 64B/65B line coding solves the DC balance or ensures few DC components. Therefore, the 9B10B line coding is a relatively better coding manner.

In the current 9B10B line coding, each control character corresponds to a 9-bit source, and namely, there are 18 9-bit sources, where each 9-bit source corresponds to a 10-bit codeword and a 10-bit control character. For example, after "0 1010 1010" is encoded, the value "01 0101 0100" is a 10-bit codeword, and the value "01 0101 0101" is a control character. If the last bit is erroneous due to channel noise, the receiver is unable to decode the bits correctly, and the performance is deteriorated. Therefore, a new 9B10B line coding mode is required.

SUMMARY

A convolutional line coding method is provided in an embodiment of the present invention.

The method includes:

constructing a sequence set, where the length of each sequence in the sequence set is n bits, and n is a natural number greater than 1;

selecting a balanced sequence in the sequence set, and obtaining source data of n−1 bits corresponding to the balanced sequence;

performing Hamming distance detection for the unbalanced sequence in the sequence set to obtain source data of n−1 bits corresponding to the unbalanced sequence; and sorting the balanced sequence and the unbalanced sequence according to an operation difference value, and generating a code table, where the source data of n−1 bits correspond to the sequence of n bits, and the code table is designed for line coding; and at time of encoding the source data of n−1 bits, obtaining a coding result of n bits according to a mapping relation in the code table.

Meanwhile, a convolutional line coder is provided herein. The coder includes:

a sequence set obtaining module, configured to construct a sequence set, where the length of each sequence is n bits;

a relation associating module, configured to: select a balanced sequence in the sequence set, and obtain source data of n−1 bits corresponding to the balanced sequence; perform Hamming distance detection for the unbalanced sequence in the sequence set to obtain source data of n−1 bits corresponding to the unbalanced sequence; and a coding module, configured to: sort the balanced sequence and the unbalanced sequence according to the operation difference value, and generating a code table, where the source data of n−1 bits correspond to the sequence of n bits; at the time of encoding the source data of n−1 bits, obtain the coding result of n bits according to the mapping relation in the code table.

Further, a coding method provided in an embodiment of the present invention includes:

performing 9B10B line coding for every 9-bit source data according to a current operation difference value of line coding, where the line coding is implemented by searching a code table.

The coding method provided herein obtains the source data of n−1 bits corresponding to the unbalanced sequence through Hamming distance detection, restricts the number of continuous 0s or 1s, and makes the amplitude limitable and controllable. The source data of n−1 bits correspond to the sequence of n bits uniquely, thus improving the coding performance.

DETAILED DESCRIPTION OF THE EMBODIMENTS

The technical solution under the present invention is expounded below with reference to accompanying drawings. Evidently, the embodiments given herein are for the exemplary purpose only, and are not the entirety of the embodiments of the present invention. Those skilled in the art can derive other embodiments from the embodiments given herein without making any creative effort, and all such embodiments are covered in the protection scope of the present invention.

A new convolutional line coding method provided herein is suitable especially for optical communication. The code rate is R=(n−1)/n, and is suitable for state convolutional coders and Viterbi decoders.

Figure 1:
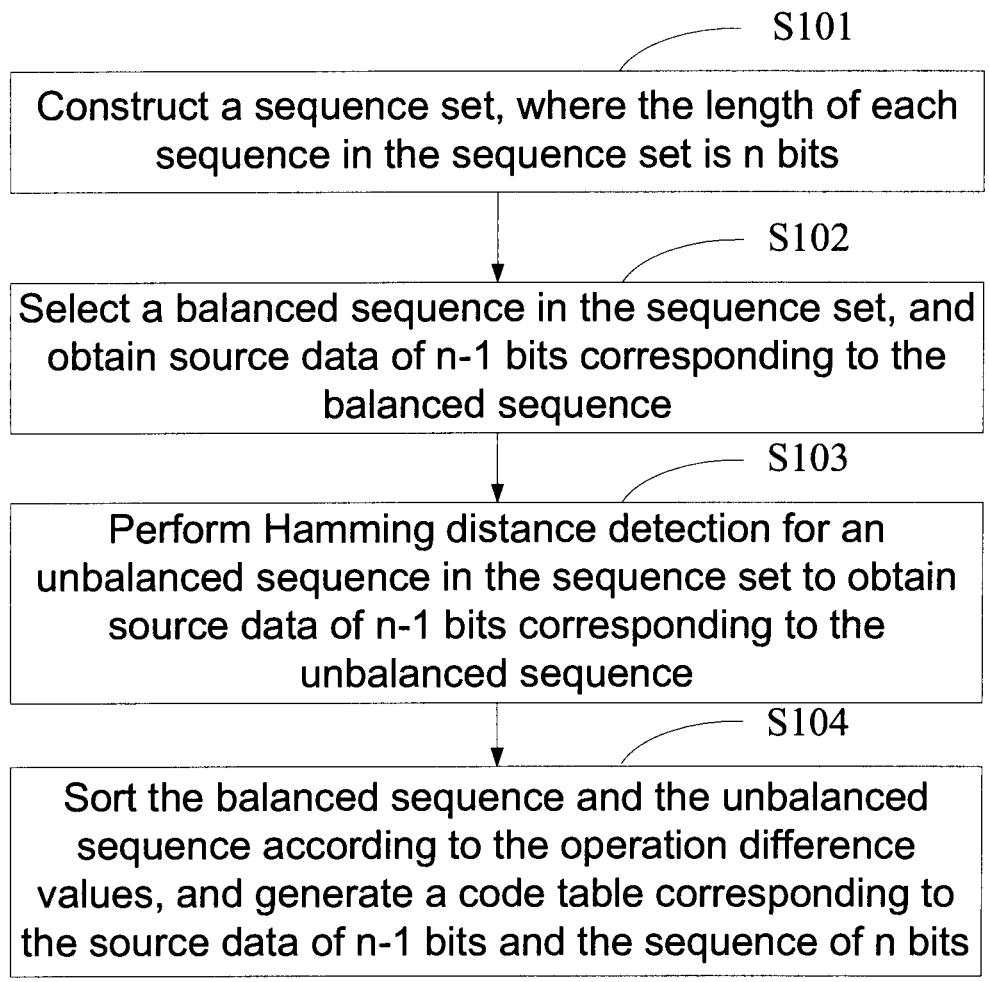
FIG. 1 is a flowchart of a method according to an embodiment of the present invention.

As shown in FIG. 1, a convolutional line coding method includes the following steps:

S101: Construct a sequence set, where the length of each sequence in the sequence set is n bits.

n is a natural number greater than 1. This set includes balanced sequences and unbalanced sequences. All codewords in this set comply with $w(\alpha) \leq W \leq n$, where $\alpha$ is any sequence of n bits in the set, $w(\alpha)$ is an operation difference value of $\alpha$, and w is a constant which is an even number. A balanced sequence refers to a sequence in which the number of 0s is equal to the number of 1s; and an unbalanced sequence refers to a sequence in which the number of 0s is unequal to the number of 1s. Alternatively, a balanced sequence refers to the sequence whose operation difference value is 0, and an unbalanced sequence refers to the sequence whose operation difference value is not 0.

The operation difference value herein is defined as: the operation difference value of a j-bit binary sequence s is the difference between the number of 0s and the number of is in the j-bit sequence s, namely, $$RDS_j(s) = \sum_{i=-\infty}^{j} s_i.$$

$S_i$ is a bit unit in the sequence s, and its value range is $\{-1, +1\}$. That is, before the operation difference value is calculated, the value range $\{0, 1\}$ of $S_i$ needs to be mapped to $\{-1, +1\}$.

S102: Select a balanced sequence in the sequence set, and obtain source data of n−1 bits corresponding to the balanced sequence.

In practice, the first or last bit in the balanced sequence may be deleted to obtain the source data of n−1 bits corresponding to the balanced sequence.

S103: Perform Hamming distance detection for the unbalanced sequence in the sequence set to obtain source data of n−1 bits corresponding to the unbalanced sequence.

When the Hamming distance reaches its minimum value, the source data of n−1 bits corresponding to the unbalanced sequence is obtained.

S104: Sort the balanced sequence and the unbalanced sequence according to the operation difference value, and generate a code table corresponding to the source data of n−1 bits and the sequence of n bits. This code table is designed for line coding. At the time of encoding the source data of n−1 bits, a coding result of n bits is obtained according to the mapping relation in the code table.

The line coding method provided herein involves low redundancy, and is applicable to line coding of optical communication systems. It ensures a specific amount of 0 and 1 transients of code streams, and is conducive to clock recovery of the receiver of the optical transmission system. The coding method provided herein obtains the source data of n−1 bits corresponding to the unbalanced sequence through Hamming distance detection, restricts the number of continuous 0s or 1s, and makes the amplitude limitable and controllable. The source data of n−1 bits correspond to the sequence of n bits uniquely, thus improving the coding performance.

Further, a W+1 state lattice graph is designed. Each lattice graph corresponds to a $2^{n-1}$ n-bit sequence set. That is, a corresponding (n−1) BnB code table is created for each w+1 state. Alternatively, the (n−1) BnB code tables corresponding to all operation difference values obtained in S104 may be aggregated into a total (n−1) BnB code table. The balanced sequence has only one corresponding (n−1) B source datum, and two unbalanced sequences correspond to one (n−1) B source datum. The two unbalanced sequences may be in a complementing relation or not.

Taking n=10 as an example, the 9B10B line coding method is described below.

In this embodiment, W is set to 4, and then a $w(\alpha) \leq 4$ 10-bit sequence set is constructed. By setting W to 4, this embodiment decreases the maximum amplitude of the designed codeword.

First, a 10-bit sequence set is constructed. In this embodiment, the sequence set includes the following 10-bit sequences: all 10-bit balanced sequences, a sequence of six 1s and four 0s, a sequence of six 0s and four 1s, a sequence of seven 1s and three 0s, and a sequence of seven 0s and three 1s.

In practice, a total of 912 10-bit sequences meet the foregoing conditions, and only 512 10-bit sequences corresponding to the 9-bit source data are required as 10-bit codewords. Therefore, the codewords with many continuous 0s or is may be further removed. For example, the 10-bit codewords which have 4 or more bits of the same value at the beginning or have 5 or more bits of the same value at the end may be deleted.

Afterward, all 10-bit balanced sequences in the 10-bit sequence set are selected, namely, five 1s and five 0s. The first bit of each 10-bit balanced sequence is deleted to obtain 9 bits, which are 9-bit source data corresponding to the 10-bit codeword. Alternatively, the last bit of each 10-bit balanced sequence is deleted to obtain 9 bits, which are 9-bit source data corresponding to the 10-bit codeword.

Perform Hamming distance detection for the unbalanced sequence in the 10-bit sequence set to obtain the 9-bit source data corresponding to the unbalanced sequence. A mapping relation is set up according to the principle that a minimum Hamming distance exists between the 9-bit source data and the 10-bit codeword.

Afterward, the sequences are sorted according to the operation difference value (or sorted in W+1 states) to generate the 9B10B code table corresponding to each operation difference value. Because W is set to 4, the obtained 9B10B codeword has five different operation difference values: −4, −2, 0, 2, and 4. The code table whose operation difference value is 0 is composed of 240 DC-balance 10-bit codewords; the code table whose operation difference value is ±2 is composed of 190 10-bit codewords, and each codeword includes six 1s (or 0s) and four 0s (or 1s); the code table whose operation difference value is ±4 is composed of 82 10-bit codewords, and each codeword includes seven 1s (or 0s) and three 0s (or 1s). In practice, the code table obtained above may be searched in the coding. Given below are exemplary code tables.

TABLE 1

| 9B | 10B |
|---|---|
| Operation difference value is −4 | |
| 000011001 | 1000010001 |
| 000011010 | 1000010010 |
| 000011100 | 1000010100 |
| 000101001 | 1000001001 |
| 000101100 | 1000001100 |
| 000110001 | 1000100001 |
| 000110010 | 1000100010 |
| 000110100 | 1000100100 |
| 000111000 | 1000011000 |
| 000111110 | 1000110000 |
| 001001001 | 0001001001 |
| 001001010 | 0001001010 |
| 001001100 | 0001001100 |
| 001010001 | 0001010001 |
| 001010010 | 0001010010 |
| 001010100 | 0001010100 |
| 001011000 | 0001011000 |
| 001100001 | 0001100001 |
| 001100010 | 0001100010 |
| 001100100 | 0001100100 |
| 001101000 | 1001001000 |
| 001110000 | 0001101000 |
| 010001001 | 0010001001 |
| 010001010 | 0010001010 |
| 010001100 | 0010001100 |
| 010010001 | 0010010001 |
| 010010010 | 0010010010 |
| 010010100 | 0010010100 |
| 010011000 | 0010011000 |
| 010100001 | 0010100001 |
| 010100010 | 0010100010 |

TABLE 1-continued

| 9B | 10B |
| --- | --- |
| 010100100 | 0010100100 |
| 010101000 | 1010001000 |
| 010110000 | 0010101000 |
| 011000001 | 0011000001 |
| 011000010 | 0011000010 |
| 011000100 | 0011000100 |
| 011001000 | 0011001000 |
| 011010000 | 1010010000 |
| 011100000 | 0010110000 |
| 011111001 | 1001000001 |
| 011111010 | 1000001010 |
| 100001001 | 0100001001 |
| 100001100 | 0100001100 |
| 100010001 | 0100010001 |
| 100010010 | 0100010010 |
| 100010100 | 0100010100 |
| 100011000 | 0100011000 |
| 100100001 | 0100100001 |
| 100100010 | 0100100010 |
| 100100100 | 0100100100 |
| 100101000 | 1000101000 |
| 100110000 | 0100101000 |
| 101000001 | 0101000001 |
| 101000010 | 0101000010 |
| 101000100 | 0101000100 |
| 101001000 | 0101001000 |
| 101010000 | 1001010000 |
| 101100000 | 0001110000 |
| 101110110 | 0001000110 |
| 101111010 | 1001000010 |
| 101111100 | 1001000100 |
| 110000001 | 1100000001 |
| 110000010 | 1100000010 |
| 110000100 | 1100000100 |
| 110001000 | 1100001000 |
| 110010000 | 1100010000 |
| 110100000 | 0100110000 |
| 110110110 | 1000000110 |
| 110111001 | 1010000001 |
| 110111010 | 1010000010 |
| 110111100 | 1010000100 |
| 111000000 | 0011010000 |
| 111000001 | 0110000001 |
| 111000010 | 0110000010 |
| 111000100 | 0110000100 |
| 111001000 | 0110001000 |
| 111010000 | 0101010000 |
| 111010110 | 0010000110 |
| 111011010 | 0100001010 |
| 111100000 | 0110010000 |
| 111100110 | 0100000110 |
| Operation difference value is −2 | |
| 000000000 | 1001010001 |
| 000000001 | 1010100001 |
| 000000010 | 1001100010 |
| 000000011 | 1010100010 |
| 000000100 | 1010010100 |
| 000000101 | 1010100100 |
| 000000110 | 0101000110 |
| 000000111 | 0110000110 |
| 000001000 | 1001011000 |
| 000001001 | 1101001000 |
| 000001010 | 1001001010 |
| 000001011 | 1010001010 |
| 000001100 | 1100001100 |
| 000001101 | 1000001101 |
| 000001110 | 1000001110 |
| 000010000 | 1010011000 |
| 000010001 | 1100010001 |
| 000010010 | 1100010010 |
| 000010011 | 1000010011 |
| 000010100 | 1100010100 |
| 000010101 | 1000010101 |
| 000010110 | 1000010110 |
| 000011000 | 1100011000 |
| 000011111 | 1000011001 |
| 000100000 | 1001100100 |
| 000100001 | 1100100001 |
| 000100010 | 1100100010 |
| 000100011 | 1000100011 |
| 000100100 | 1100100100 |
| 000100101 | 1000100101 |
| 000100110 | 1000100110 |
| 000101000 | 1100101000 |
| 000101010 | 1000101010 |
| 000101111 | 1000101100 |
| 000110000 | 1010110000 |
| 000110111 | 1000110100 |
| 000111011 | 1000111000 |
| 000111101 | 1000101001 |
| 000111111 | 1000011100 |
| 001000000 | 1001101000 |
| 001000001 | 1101000001 |
| 001000010 | 1101000010 |
| 001000011 | 1001000011 |
| 001000100 | 1101000100 |
| 001000101 | 1001000101 |
| 001000110 | 1001000110 |
| 001001000 | 0100000111 |
| 001010000 | 1011010000 |
| 001011111 | 0001010011 |
| 001100000 | 0001000111 |
| 001101111 | 0001101100 |
| 001110111 | 0001110100 |
| 001111011 | 0001111000 |
| 001111101 | 0001100011 |
| 001111110 | 0001101001 |
| 001111111 | 0001010110 |
| 010000000 | 1010101000 |
| 010000001 | 1011000001 |
| 010000010 | 1011000010 |
| 010000011 | 1010000011 |
| 010000100 | 1011000100 |
| 010000101 | 1010000101 |
| 010000110 | 1010000110 |
| 010001000 | 1000000111 |
| 010010000 | 1000001011 |
| 010011111 | 0010001011 |
| 010100000 | 0010000111 |
| 010101111 | 0010101100 |
| 010110111 | 0010110100 |
| 010111011 | 0010111000 |
| 010111101 | 0010100011 |
| 010111110 | 0010100101 |
| 010111111 | 0010110001 |
| 011000000 | 0001001011 |
| 011001111 | 0011001100 |
| 011010111 | 0011010100 |
| 011011011 | 0011011000 |
| 011011101 | 0011000011 |
| 011011110 | 0010011001 |
| 011011111 | 0010010110 |
| 011100111 | 0011100100 |
| 011101011 | 0011101000 |
| 011101101 | 0001010101 |
| 011101110 | 0010101001 |
| 011101111 | 1011001000 |
| 011110011 | 0011100010 |
| 011110101 | 0010010101 |
| 011110110 | 0011000101 |
| 011110111 | 0010100110 |
| 011111011 | 0010101010 |
| 011111100 | 0011001001 |
| 011111101 | 0011100001 |
| 011111110 | 0010110010 |
| 011111111 | 1010010001 |
| 100000000 | 1001110000 |
| 100000001 | 1110000001 |
| 100000010 | 1110000010 |
| 100000011 | 1100000011 |
| 100000100 | 1110000100 |
| 100000101 | 1100000101 |
| 100000110 | 1100000110 |
| 100001000 | 1110001000 |
| 100001010 | 1100001010 |

TABLE 1-continued

| 9B | 10B |
|---|---|
| 100010000 | 1101010000 |
| 100011111 | 0100011100 |
| 100100000 | 1100110000 |
| 100101111 | 0100101100 |
| 100110111 | 0100110100 |
| 100111011 | 0100111000 |
| 100111101 | 0100100011 |
| 100111110 | 0100100101 |
| 100111111 | 1000110010 |
| 101000000 | 0100001011 |
| 101001111 | 0101001100 |
| 101010111 | 0101010100 |
| 101011011 | 0101011000 |
| 101011101 | 0101000011 |
| 101011110 | 0001011001 |
| 101011111 | 0001011010 |
| 101100111 | 0101100100 |
| 101101011 | 0101101000 |
| 101101101 | 0001001101 |
| 101101110 | 0101001001 |
| 101101111 | 0001001110 |
| 101110011 | 0101100010 |
| 101110101 | 0001100101 |
| 101110111 | 0001100110 |
| 101111001 | 1001001001 |
| 101111011 | 0001101010 |
| 101111101 | 0101010001 |
| 101111110 | 0001110010 |
| 101111111 | 1001100001 |
| 110000000 | 1110010000 |
| 110001111 | 0110001100 |
| 110010111 | 0110010100 |
| 110011011 | 0110010010 |
| 110011101 | 0110000011 |
| 110011110 | 0100011001 |
| 110011111 | 0010011010 |
| 110100111 | 0110100100 |
| 110101011 | 0110001010 |
| 110101101 | 0010001101 |
| 110101110 | 0100101001 |
| 110101111 | 0010001110 |
| 110110011 | 0110100010 |
| 110110101 | 0100010101 |
| 110110111 | 0100100110 |
| 110111011 | 0100101010 |
| 110111101 | 0100110001 |
| 110111110 | 0100110010 |
| 110111111 | 1000011010 |
| 111000111 | 0111000100 |
| 111001011 | 0111000010 |
| 111001101 | 0100001101 |
| 111001110 | 0110001001 |
| 111001111 | 0100001110 |
| 111010011 | 0010010011 |
| 111010101 | 0101000101 |
| 111010111 | 0100010110 |
| 111011001 | 1010001001 |
| 111011011 | 0100011010 |
| 111011100 | 0110011000 |
| 111011101 | 0110010001 |
| 111011110 | 0001011100 |
| 111011111 | 1001001100 |
| 111100011 | 0100010011 |
| 111100101 | 0110000101 |
| 111100111 | 0011000110 |
| 111101001 | 1100001001 |
| 111101010 | 0110101000 |
| 111101011 | 0011001010 |
| 111101100 | 0110011000 |
| 111101101 | 0101100001 |
| 111101110 | 0101001010 |
| 111101111 | 1010001100 |
| 111110001 | 0011110000 |
| 111110010 | 0101110000 |
| 111110011 | 0011010001 |
| 111110100 | 0110110000 |
| 111110101 | 0110100001 |
| 111110110 | 0011010010 |
| 111110111 | 1001010010 |
| 111111000 | 0111010000 |
| 111111001 | 0111000001 |
| 111111010 | 0101010010 |
| 111111011 | 1010010010 |
| 111111100 | 0010011100 |
| 111111101 | 0001110001 |
| 111111110 | 1001010100 |
| 111111111 | 1000110001 |
| Operation difference value is 0 | |
| 000001111 | 1000001111 |
| 000010111 | 1000010111 |
| 000011011 | 1000011011 |
| 000011101 | 1000011101 |
| 000011110 | 1000011110 |
| 000100111 | 1000100111 |
| 000101011 | 1000101011 |
| 000101101 | 1000101101 |
| 000101110 | 1000101110 |
| 000110011 | 1000110011 |
| 000110101 | 1000110101 |
| 000110110 | 1000110110 |
| 000111001 | 1000111001 |
| 000111010 | 1000111010 |
| 000111100 | 1000111100 |
| 001000111 | 1001000111 |
| 001001011 | 1001001011 |
| 001001101 | 1001001101 |
| 001001110 | 1001001110 |
| 001001111 | 0001001111 |
| 001010011 | 1001010011 |
| 001010101 | 1001010101 |
| 001010110 | 1001010110 |
| 001010111 | 0001010111 |
| 001011001 | 1001011001 |
| 001011010 | 1001011010 |
| 001011011 | 0001011011 |
| 001011100 | 1001011100 |
| 001011101 | 0001011101 |
| 001011110 | 0001011110 |
| 001100011 | 1001100011 |
| 001100101 | 1001100101 |
| 001100110 | 1001100110 |
| 001100111 | 0001100111 |
| 001101001 | 1001101001 |
| 001101010 | 1001101010 |
| 001101011 | 0001101011 |
| 001101100 | 1001101100 |
| 001101101 | 0001101101 |
| 001101110 | 0001101110 |
| 001110001 | 1001110001 |
| 001110010 | 1001110010 |
| 001110011 | 0001110011 |
| 001110100 | 1001110100 |
| 001110101 | 0001110101 |
| 001110110 | 0001110110 |
| 001111000 | 1001111000 |
| 001111001 | 0001111001 |
| 001111010 | 0001111010 |
| 001111100 | 0001111100 |
| 010000111 | 1010000111 |
| 010001011 | 1010001011 |
| 010001101 | 1010001101 |
| 010001110 | 1010001110 |
| 010001111 | 0010001111 |
| 010010011 | 1010010011 |
| 010010101 | 1010010101 |
| 010010110 | 1010010110 |
| 010010111 | 0010010111 |
| 010011001 | 1010011001 |
| 010011010 | 1010011010 |
| 010011011 | 0010011011 |
| 010011100 | 1010011100 |
| 010011101 | 0010011101 |
| 010011110 | 0010011110 |
| 010100011 | 1010100011 |
| 010100101 | 1010100101 |

TABLE 1-continued

| 9B | 10B |
|---|---|
| 010100110 | 1010100110 |
| 010100111 | 0010100111 |
| 010101001 | 1010101001 |
| 010101010 | 1010101010 |
| 010101011 | 0010101011 |
| 010101100 | 1010101100 |
| 010101101 | 0010101101 |
| 010101110 | 0010101110 |
| 010110001 | 1010110001 |
| 010110010 | 1010110010 |
| 010110011 | 0010110011 |
| 010110100 | 1010110100 |
| 010110101 | 0010110101 |
| 010110110 | 0010110110 |
| 010111000 | 1010111000 |
| 010111001 | 0010111001 |
| 010111010 | 0010111010 |
| 010111100 | 0010111100 |
| 011000011 | 1011000011 |
| 011000101 | 1011000101 |
| 011000110 | 1011000110 |
| 011000111 | 0011000111 |
| 011001001 | 1011001001 |
| 011001010 | 1011001010 |
| 011001011 | 0011001011 |
| 011001100 | 1011001100 |
| 011001101 | 0011001101 |
| 011001110 | 0011001110 |
| 011010001 | 1011010001 |
| 011010010 | 1011010010 |
| 011010011 | 0011010011 |
| 011010100 | 1011010100 |
| 011010101 | 0011010101 |
| 011010110 | 0011010110 |
| 011011000 | 1011011000 |
| 011011001 | 0011011001 |
| 011011010 | 0011011010 |
| 011011100 | 0011011100 |
| 011100001 | 1011100001 |
| 011100010 | 1011100010 |
| 011100011 | 0011100011 |
| 011100100 | 1011100100 |
| 011100101 | 0011100101 |
| 011100110 | 0011100110 |
| 011101000 | 1011101000 |
| 011101001 | 0011101001 |
| 011101010 | 0011101010 |
| 011101100 | 0011101100 |
| 011110000 | 1011110000 |
| 011110001 | 0011110001 |
| 011110010 | 0011110010 |
| 011110100 | 0011110100 |
| 011111000 | 0011111000 |
| 100000111 | 1100000111 |
| 100001011 | 1100001011 |
| 100001101 | 1100001101 |
| 100001110 | 1100001110 |
| 100001111 | 0100001111 |
| 100010011 | 1100010011 |
| 100010101 | 1100010101 |
| 100010110 | 1100010110 |
| 100010111 | 0100010111 |
| 100011001 | 1100011001 |
| 100011010 | 1100011010 |
| 100011011 | 0100011011 |
| 100011100 | 1100011100 |
| 100011101 | 0100011101 |
| 100011110 | 0100011110 |
| 100100011 | 1100100011 |
| 100100101 | 1100100101 |
| 100100110 | 1100100110 |
| 100100111 | 0100100111 |
| 100101001 | 1100101001 |
| 100101010 | 1100101010 |
| 100101011 | 0100101011 |
| 100101100 | 1100101100 |
| 100101101 | 0100101101 |
| 100101110 | 0100101110 |
| 100110001 | 1100110001 |
| 100110010 | 1100110010 |
| 100110011 | 0100110011 |
| 100110100 | 1100110100 |
| 100110101 | 0100110101 |
| 100110110 | 0100110110 |
| 100111000 | 1100111000 |
| 100111001 | 0100111001 |
| 100111010 | 0100111010 |
| 100111100 | 0100111100 |
| 101000011 | 1101000011 |
| 101000101 | 1101000101 |
| 101000110 | 1101000110 |
| 101000111 | 0101000111 |
| 101001001 | 1101001001 |
| 101001010 | 1101001010 |
| 101001011 | 0101001011 |
| 101001100 | 1101001100 |
| 101001101 | 0101001101 |
| 101001110 | 0101001110 |
| 101010001 | 1101010001 |
| 101010010 | 1101010010 |
| 101010011 | 0101010011 |
| 101010100 | 1101010100 |
| 101010101 | 0101010101 |
| 101010110 | 0101010110 |
| 101011000 | 1101011000 |
| 101011001 | 0101011001 |
| 101011010 | 0101011010 |
| 101011100 | 0101011100 |
| 101100001 | 1101100001 |
| 101100010 | 1101100010 |
| 101100011 | 0101100011 |
| 101100100 | 1101100100 |
| 101100101 | 0101100101 |
| 101100110 | 0101100110 |
| 101101000 | 1101101000 |
| 101101001 | 0101101001 |
| 101101010 | 0101101010 |
| 101101100 | 0101101100 |
| 101110000 | 1101110000 |
| 101110001 | 0101110001 |
| 101110010 | 0101110010 |
| 101110100 | 0101110100 |
| 101111000 | 0101111000 |
| 110000011 | 1110000011 |
| 110000101 | 1110000101 |
| 110000110 | 1110000110 |
| 110000111 | 0110000111 |
| 110001001 | 1110001001 |
| 110001010 | 1110001010 |
| 110001011 | 0110001011 |
| 110001100 | 1110001100 |
| 110001101 | 0110001101 |
| 110001110 | 0110001110 |
| 110010001 | 1110010001 |
| 110010010 | 1110010010 |
| 110010011 | 0110010011 |
| 110010100 | 1110010100 |
| 110010101 | 0110010101 |
| 110010110 | 0110010110 |
| 110011000 | 1110011000 |
| 110011001 | 0110011001 |
| 110011010 | 0110011010 |
| 110011100 | 0110011100 |
| 110100001 | 1110100001 |
| 110100010 | 1110100010 |
| 110100011 | 0110100011 |
| 110100100 | 1110100100 |
| 110100101 | 0110100101 |
| 110100110 | 0110100110 |
| 110101000 | 1110101000 |
| 110101001 | 0110101001 |
| 110101010 | 0110101010 |
| 110101100 | 0110101100 |
| 110110000 | 1110110000 |
| 110110001 | 0110110001 |
| 110110010 | 0110110010 |

TABLE 1-continued

| 9B | 10B |
|---|---|
| 110110100 | 0110110100 |
| 110111000 | 0110111000 |
| 111000011 | 0111000011 |
| 111000101 | 0111000101 |
| 111000110 | 0111000110 |
| 111001001 | 0111001001 |
| 111001010 | 0111001010 |
| 111001100 | 0111001100 |
| 111010001 | 0111010001 |
| 111010010 | 0111010010 |
| 111010100 | 0111010100 |
| 111011000 | 0111011000 |
| 111100001 | 0111100001 |
| 111100010 | 0111100010 |
| 111100100 | 0111100100 |
| 111101000 | 0111101000 |
| 111110000 | 0111110000 |
| Operation difference value is 2 | |
| 000000111 | 1010100111 |
| 000001010 | 1001001111 |
| 000001011 | 1101001011 |
| 000001100 | 1010001111 |
| 000001101 | 1101001101 |
| 000001110 | 1100001111 |
| 000010010 | 1001011011 |
| 000010011 | 1110010011 |
| 000010100 | 1001010111 |
| 000010101 | 1110010101 |
| 000010110 | 1100010111 |
| 000011000 | 1010011011 |
| 000011001 | 1100011101 |
| 000011010 | 1001011110 |
| 000011100 | 1010011110 |
| 000011111 | 1100011110 |
| 000100011 | 1010110011 |
| 000100101 | 1010110101 |
| 000100110 | 1100100111 |
| 000101000 | 1010101011 |
| 000101001 | 1100101101 |
| 000101010 | 1100101011 |
| 000101100 | 1100101110 |
| 000101111 | 1000101111 |
| 000110001 | 1100111001 |
| 000110010 | 1100110011 |
| 000110100 | 1100110101 |
| 000110111 | 1000110111 |
| 000111000 | 1100111010 |
| 000111011 | 1000111011 |
| 000111101 | 1000111101 |
| 000111110 | 1000111110 |
| 001000010 | 1001101011 |
| 001000011 | 1101010011 |
| 001000100 | 1001100111 |
| 001000101 | 1101100101 |
| 001000110 | 1101000111 |
| 001001000 | 1001101101 |
| 001001001 | 1001111001 |
| 001001010 | 1001101110 |
| 001001100 | 1101001110 |
| 001010000 | 1001110011 |
| 001010001 | 1101011001 |
| 001010010 | 1101011010 |
| 001010100 | 1101010110 |
| 001011000 | 1101011100 |
| 001011111 | 1001011101 |
| 001100000 | 1001110101 |
| 001100001 | 1101101001 |
| 001100010 | 1001111010 |
| 001100100 | 1001110110 |
| 001101000 | 1101101010 |
| 001101111 | 0001101111 |
| 001110000 | 1001111100 |
| 001110111 | 0001110111 |
| 001111011 | 0001111011 |
| 001111101 | 0001111101 |
| 001111110 | 0001111110 |
| 010000010 | 1011001011 |
| 010000011 | 1011100011 |
| 010000100 | 1010010111 |
| 010000101 | 1011100101 |
| 010000110 | 1011000111 |
| 010001000 | 1011001101 |
| 010001001 | 1010111001 |
| 010001010 | 1010101110 |
| 010001100 | 1011001110 |
| 010010000 | 1011010011 |
| 010010001 | 1011011001 |
| 010010010 | 1011011010 |
| 010010100 | 1011010110 |
| 010011000 | 1011011100 |
| 010011111 | 1010011101 |
| 010100000 | 1010101101 |
| 010100001 | 1011101001 |
| 010100010 | 1010111010 |
| 010100100 | 1010110110 |
| 010101000 | 1011101010 |
| 010101111 | 0010101111 |
| 010110000 | 1010111100 |
| 010110111 | 0010110111 |
| 010111011 | 0010111011 |
| 010111101 | 0010111101 |
| 010111110 | 0010111110 |
| 011000000 | 1011010101 |
| 011000001 | 1011110001 |
| 011000010 | 1011110010 |
| 011000100 | 1011100110 |
| 011001000 | 1011101100 |
| 011001111 | 0011001111 |
| 011010000 | 1011110100 |
| 011010111 | 0011010111 |
| 011011011 | 0011011011 |
| 011011101 | 0011011101 |
| 011011110 | 0011011110 |
| 011100000 | 1011111000 |
| 011100111 | 0011100111 |
| 011101011 | 0011101011 |
| 011101101 | 0011101101 |
| 011101110 | 0011101110 |
| 011110011 | 0011110011 |
| 011110101 | 0011110101 |
| 011110110 | 0011110110 |
| 011111001 | 0011111001 |
| 011111010 | 0011111010 |
| 011111100 | 0011111100 |
| 100000011 | 1101100011 |
| 100000101 | 1110100101 |
| 100000110 | 1110000111 |
| 100001001 | 1110001101 |
| 100001010 | 1110001011 |
| 100001100 | 1110001110 |
| 100010001 | 1110011001 |
| 100010010 | 1110011010 |
| 100010100 | 1110010110 |
| 100011000 | 1110011100 |
| 100011111 | 1100011011 |
| 100100001 | 1110101001 |
| 100100010 | 1110100011 |
| 100100100 | 1100110110 |
| 100101000 | 1110101010 |
| 100101111 | 0100101111 |
| 100110000 | 1100111100 |
| 100110111 | 0100110111 |
| 100111011 | 0100111011 |
| 100111101 | 0100111101 |
| 100111110 | 0100111110 |
| 101000000 | 1101010101 |
| 101000001 | 1101110001 |
| 101000010 | 1101110010 |
| 101000100 | 1101100110 |
| 101001000 | 1101101100 |
| 101001111 | 0101001111 |
| 101010000 | 1101110100 |
| 101010111 | 0101010111 |
| 101011011 | 0101011011 |
| 101011101 | 0101011101 |

TABLE 1-continued

| 9B | 10B |
|---|---|
| 101011110 | 0101011110 |
| 101100000 | 1101111000 |
| 101100111 | 0101100111 |
| 101101011 | 0101101011 |
| 101101101 | 0101101101 |
| 101101110 | 0101101110 |
| 101110011 | 0101110011 |
| 101110101 | 0101110101 |
| 101110110 | 0101110110 |
| 101111001 | 0101111001 |
| 101111010 | 0101111010 |
| 101111100 | 0101111100 |
| 110000001 | 1110110001 |
| 110000010 | 1110110010 |
| 110000100 | 1110100110 |
| 110001000 | 1110101100 |
| 110001111 | 0110001111 |
| 110010000 | 1110110100 |
| 110010111 | 0110010111 |
| 110011011 | 0110011011 |
| 110011101 | 0110011101 |
| 110011110 | 0110011110 |
| 110100000 | 1110111000 |
| 110100111 | 0110100111 |
| 110101011 | 0110101011 |
| 110101101 | 0110101101 |
| 110101110 | 0110101110 |
| 110110011 | 0110110011 |
| 110110101 | 0110110101 |
| 110110110 | 0110110110 |
| 110111001 | 0110111001 |
| 110111010 | 0110111010 |
| 110111100 | 0110111100 |
| 111000000 | 0111101010 |
| 111000001 | 0111110001 |
| 111000010 | 0111110010 |
| 111000100 | 0111011100 |
| 111000111 | 0111000111 |
| 111001000 | 0111101100 |
| 111001011 | 0111001011 |
| 111001101 | 0111001101 |
| 111001110 | 0111001110 |
| 111010000 | 0111110100 |
| 111010011 | 0111010011 |
| 111010101 | 0111010101 |
| 111010110 | 0111010110 |
| 111011001 | 0111011001 |
| 111011010 | 0111011010 |
| 111100000 | 0111111000 |
| 111100011 | 0111100011 |
| 111100101 | 0111100101 |
| 111100110 | 0111100110 |
| 111101001 | 0111101001 |
| Operation difference value is 4 | |
| 000000000 | 1010110111 |
| 000000001 | 1100111011 |
| 000000010 | 1100111011 |
| 000000011 | 1110110011 |
| 000000100 | 1101100111 |
| 000000101 | 1011110101 |
| 000000110 | 1011110110 |
| 000001000 | 1011101011 |
| 000001001 | 1110101101 |
| 000010000 | 1110011011 |
| 000010001 | 1101110101 |
| 000100000 | 1011110011 |
| 000100001 | 1110110101 |
| 000100010 | 1011111010 |
| 000100100 | 1101110110 |
| 000110000 | 1011111100 |
| 000111111 | 1100111110 |
| 001000000 | 1001111101 |
| 001000001 | 1101111001 |
| 001111111 | 1001111110 |
| 010000000 | 1011011101 |
| 010000001 | 1011111001 |
| 010111111 | 1010111101 |

| 9B | 10B |
|---|---|
| 011011111 | 1011011110 |
| 011101111 | 1011101101 |
| 011110111 | 0011110111 |
| 011111011 | 0011111011 |
| 011111101 | 0011111101 |
| 011111110 | 1011101110 |
| 011111111 | 1011010111 |
| 100000000 | 1101110011 |
| 100000001 | 1110111001 |
| 100000010 | 1110101110 |
| 100000100 | 1110110110 |
| 100001000 | 1101111010 |
| 100010000 | 1110111010 |
| 100100000 | 1101111100 |
| 100111111 | 1100111101 |
| 101011111 | 1101011101 |
| 101101111 | 1101101011 |
| 101110111 | 0101110111 |
| 101111011 | 0101111011 |
| 101111101 | 0101111101 |
| 101111110 | 1101011110 |
| 101111111 | 1101010111 |
| 110000000 | 1110111100 |
| 110011111 | 1110011101 |
| 110101111 | 1110100111 |
| 110110111 | 0110110111 |
| 110111011 | 0110111011 |
| 110111101 | 0110111101 |
| 110111110 | 1010111110 |
| 110111111 | 1100110111 |
| 111001111 | 1110001111 |
| 111010111 | 0111010111 |
| 111011011 | 0111011011 |
| 111011100 | 0111011110 |
| 111011101 | 0111011101 |
| 111011110 | 1110011110 |
| 111011111 | 1110010111 |
| 111100111 | 0111100111 |
| 111101010 | 0111101011 |
| 111101011 | 1110101011 |
| 111101100 | 0111101110 |
| 111101101 | 1101101101 |
| 111101110 | 1101101110 |
| 111101111 | 1101001111 |
| 111110001 | 0111111001 |
| 111110010 | 0111111010 |
| 111110011 | 0111110011 |
| 111110100 | 0111110110 |
| 111110101 | 0111101101 |
| 111110110 | 0011111110 |
| 111110111 | 1011100111 |
| 111111000 | 0111111100 |
| 111111001 | 0111110101 |
| 111111010 | 0101111110 |
| 111111011 | 1001111011 |
| 111111100 | 0110111110 |
| 111111101 | 1010111011 |
| 111111110 | 1011011011 |
| 111111111 | 1001110111 |

Figure 2:
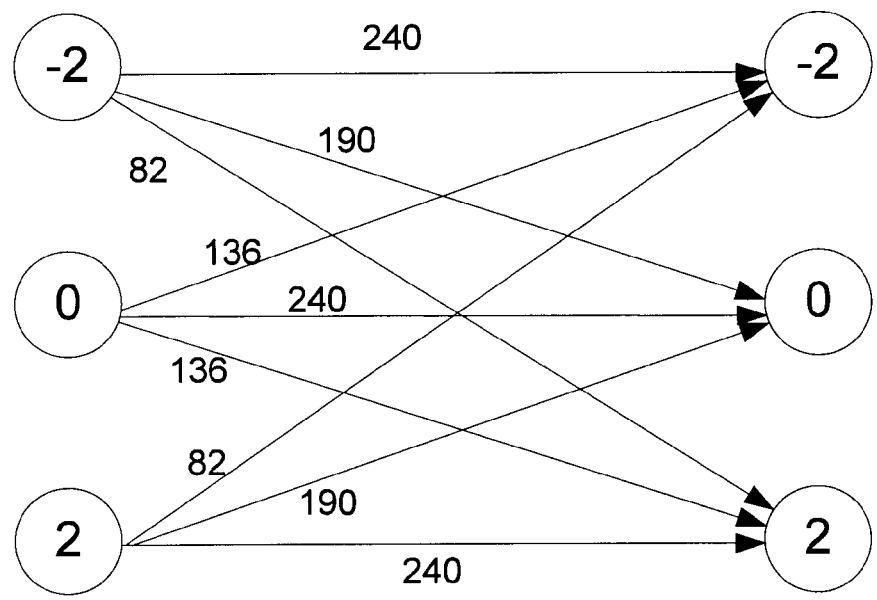
FIG. 2 is a state graph, corresponding to a 3-state lattice graph designed, according to an embodiment of the present invention.

Further, a lattice graph of W+1=5 states is designed, and the five states correspond to −4, −2, 0, 2, and 4. In this embodiment, n is set to 10. In order to reduce complexity, a 3-state lattice graph is designed additionally. FIG. 2 is a state graph, corresponding to a 3-state lattice graph designed, according to an embodiment of the present invention. Each lattice graph corresponds to 512 10-bit sequence sets, namely, a corresponding 9B10B code table is created for each state. The solution under the present invention has three states: −2, 0, and +2. In this case, the operation difference still has five values: −4, −2, 0, 2, and 4.

The 9B10B code table corresponding to the state "−2" may be a combination of the code tables sorted according to the operation difference value: 240 balanced codes plus 190 unbalanced codes whose operation difference value is +2 plus 82 unbalanced codes whose operation difference value is +4.

The 9B10B code table corresponding to the state "0" may be a combination of the code tables sorted according to the operation difference value: 240 balanced codes plus the first 136 codewords of the unbalanced code table whose operation difference value is +2 plus the first 136 codewords of the unbalanced code table whose operation difference value is −2.

The 9B10B code table corresponding to the state "+2" may be a combination of the code tables sorted according to the operation difference value: 240 balanced codes plus 190 unbalanced codes whose operation difference value is −2 plus 82 unbalanced codes whose operation difference value is −4.

The overall code table is as follows:

TABLE 2

Code table

| 9B (decimal) | 10B Binary | Decimal | Operation difference value | 10B Binary | Decimal | Operation difference value |
|---|---|---|---|---|---|---|
| 0 | 1010110111 | 695 | 4 | 1001010001 | 593 | −2 |
| 1 | 1100111011 | 827 | 4 | 1010100001 | 673 | −2 |
| 2 | 1101011011 | 859 | 4 | 1001100010 | 610 | −2 |
| 3 | 1110110011 | 947 | 4 | 1010100010 | 674 | −2 |
| 4 | 1101100111 | 871 | 4 | 1010010100 | 660 | −2 |
| 5 | 1011110101 | 757 | 4 | 1010100100 | 676 | −2 |
| 6 | 1011110110 | 758 | 4 | 0101000110 | 326 | −2 |
| 7 | 1010100111 | 679 | 2 | 0110000110 | 390 | −2 |
| 8 | 1011101011 | 747 | 4 | 1001011000 | 600 | −2 |
| 9 | 1110101101 | 941 | 4 | 1101001000 | 840 | −2 |
| 10 | 1001001111 | 591 | 2 | 1001001010 | 586 | −2 |
| 11 | 1101001011 | 843 | 2 | 1010001010 | 650 | −2 |
| 12 | 1010001111 | 655 | 2 | 1100001100 | 780 | −2 |
| 13 | 1101001101 | 845 | 2 | 1000001101 | 525 | −2 |
| 14 | 1100001111 | 783 | 2 | 1000001110 | 526 | −2 |
| 15 | 1000001111 | 527 | 0 | | | |
| 16 | 1110011011 | 923 | 4 | 1010011000 | 664 | −2 |
| 17 | 1101110101 | 885 | 4 | 1100010001 | 785 | −2 |
| 18 | 1001011011 | 603 | 2 | 1100010010 | 786 | −2 |
| 19 | 1110010011 | 915 | 2 | 1000010011 | 531 | −2 |
| 20 | 1001010111 | 599 | 2 | 1100010100 | 788 | −2 |
| 21 | 1110010101 | 917 | 2 | 1000010101 | 533 | −2 |
| 22 | 1100010111 | 791 | 2 | 1000010110 | 534 | −2 |
| 23 | 1000010111 | 535 | 0 | | | |
| 24 | 1010011011 | 667 | 2 | 1100011000 | 792 | −2 |
| 25 | 1100011101 | 797 | 2 | 1000010001 | 529 | −4 |
| 26 | 1001011110 | 606 | 2 | 1000010010 | 530 | −4 |
| 27 | 1000011011 | 539 | 0 | | | |
| 28 | 1010011110 | 670 | 2 | 1000010100 | 532 | −4 |
| 29 | 1000011101 | 541 | 0 | | | |
| 30 | 1000011110 | 542 | 0 | | | |
| 31 | 1100011110 | 798 | 2 | 1000011001 | 537 | −2 |
| 32 | 1011110011 | 755 | 4 | 1001100100 | 612 | −2 |
| 33 | 1110110101 | 949 | 4 | 1100100001 | 801 | −2 |
| 34 | 1011111010 | 762 | 4 | 1100100010 | 802 | −2 |
| 35 | 1010110011 | 691 | 2 | 1000100011 | 547 | −2 |
| 36 | 1101110110 | 886 | 4 | 1100100100 | 804 | −2 |
| 37 | 1010110101 | 693 | 2 | 1000100101 | 549 | −2 |
| 38 | 1100100111 | 807 | 2 | 1000100110 | 550 | −2 |
| 39 | 1000100111 | 551 | 0 | | | |
| 40 | 1010101011 | 683 | 2 | 1100101000 | 808 | −2 |
| 41 | 1100101101 | 813 | 2 | 1000001001 | 521 | −4 |
| 42 | 1100101011 | 811 | 2 | 1000101010 | 554 | −2 |
| 43 | 1000101011 | 555 | 0 | | | |
| 44 | 1100101110 | 814 | 2 | 1000001100 | 524 | −4 |
| 45 | 1000101101 | 557 | 0 | | | |
| 46 | 1000101110 | 558 | 0 | | | |
| 47 | 1000101111 | 559 | 2 | 1000101100 | 556 | −2 |
| 48 | 1011111100 | 764 | 4 | 1010110000 | 688 | −2 |
| 49 | 1100111001 | 825 | 2 | 1000100001 | 545 | −4 |
| 50 | 1100110011 | 819 | 2 | 1000100010 | 546 | −4 |
| 51 | 1000110011 | 563 | 0 | 1000110011 | 563 | 0 |
| 52 | 1100110101 | 821 | 2 | 1000100100 | 548 | −4 |
| 53 | 1000110101 | 565 | 0 | | | |
| 54 | 1000110110 | 566 | 0 | | | |
| 55 | 1000110111 | 567 | 2 | 1000110100 | 564 | −2 |
| 56 | 1100111010 | 826 | 2 | 1000011000 | 536 | −4 |
| 57 | 1000111001 | 569 | 0 | | | |
| 58 | 1000111010 | 570 | 0 | | | |
| 59 | 1000111011 | 571 | 2 | 1000111000 | 568 | −2 |
| 60 | 1000111100 | 572 | 0 | | | |
| 61 | 1000111101 | 573 | 2 | 1000101001 | 553 | −2 |
| 62 | 1000111110 | 574 | 2 | 1000110000 | 560 | −4 |
| 63 | 1100111110 | 830 | 4 | 1000011100 | 540 | −2 |

TABLE 2-continued

Code table

| 9B (decimal) | 10B Binary | Decimal | Operation difference value | 10B Binary | Decimal | Operation difference value |
|---|---|---|---|---|---|---|
| 64 | 1001111101 | 637 | 4 | 1001101000 | 616 | −2 |
| 65 | 1101111001 | 889 | 4 | 1101000001 | 833 | −2 |
| 66 | 1001101011 | 619 | 2 | 1101000010 | 834 | −2 |
| 67 | 1101010011 | 851 | 2 | 1001000011 | 579 | −2 |
| 68 | 1001100111 | 615 | 2 | 1101000100 | 836 | −2 |
| 69 | 1101100101 | 869 | 2 | 1001000101 | 581 | −2 |
| 70 | 1101000111 | 839 | 2 | 1001000110 | 582 | −2 |
| 71 | 1001000111 | 583 | 0 | | | |
| 72 | 1001101101 | 621 | 2 | 0100000111 | 263 | −2 |
| 73 | 1001111001 | 633 | 2 | 0001001001 | 73 | −4 |
| 74 | 1001101110 | 622 | 2 | 0001001010 | 74 | −4 |
| 75 | 1001001011 | 587 | 0 | | | |
| 76 | 1101001110 | 846 | 2 | 0001001100 | 76 | −4 |
| 77 | 1001001101 | 589 | 0 | | | |
| 78 | 1001001110 | 590 | 0 | | | |
| 79 | 0001001111 | 79 | 0 | | | |
| 80 | 1001110011 | 627 | 2 | 1011010000 | 720 | −2 |
| 81 | 1101011001 | 857 | 2 | 0001010001 | 81 | −4 |
| 82 | 1101011010 | 858 | 2 | 0001010010 | 82 | −4 |
| 83 | 1001010011 | 595 | 0 | | | |
| 84 | 1101010110 | 854 | 2 | 0001010100 | 84 | −4 |
| 85 | 1001010101 | 597 | 0 | | | |
| 86 | 1001010110 | 598 | 0 | | | |
| 87 | 0001010111 | 87 | 0 | | | |
| 88 | 1101011100 | 860 | 2 | 0001011000 | 88 | −4 |
| 89 | 1001011001 | 601 | 0 | | | |
| 90 | 1001011010 | 602 | 0 | | | |
| 91 | 0001011011 | 91 | 0 | | | |
| 92 | 1001011100 | 604 | 0 | | | |
| 93 | 0001011101 | 93 | 0 | | | |
| 94 | 0001011110 | 94 | 0 | | | |
| 95 | 1001011101 | 605 | 2 | 0001010011 | 83 | −2 |
| 96 | 1001110101 | 629 | 2 | 0001000111 | 71 | −2 |
| 97 | 1101101001 | 873 | 2 | 0001100001 | 97 | −4 |
| 98 | 1001111010 | 634 | 2 | 0001100010 | 98 | −4 |
| 99 | 1001100011 | 611 | 0 | | | |
| 100 | 1001110110 | 630 | 2 | 0001100100 | 100 | −4 |
| 101 | 1001100101 | 613 | 0 | | | |
| 102 | 1001100110 | 614 | 0 | | | |
| 103 | 0001100111 | 103 | 0 | | | |
| 104 | 1101101010 | 874 | 2 | 1001001000 | 584 | −4 |
| 105 | 1001101001 | 617 | 0 | | | |
| 106 | 1001101010 | 618 | 0 | | | |
| 107 | 0001101011 | 107 | 0 | | | |
| 108 | 1001101100 | 620 | 0 | | | |
| 109 | 0001101101 | 109 | 0 | | | |
| 110 | 0001101110 | 110 | 0 | | | |
| 111 | 0001101111 | 111 | 2 | 0001101100 | 108 | −2 |
| 112 | 1001111100 | 636 | 2 | 0001101000 | 104 | −4 |
| 113 | 1001110001 | 625 | 0 | | | |
| 114 | 1001110010 | 626 | 0 | | | |
| 115 | 0001110011 | 115 | 0 | | | |
| 116 | 1001110100 | 628 | 0 | | | |
| 117 | 0001110101 | 117 | 0 | | | |
| 118 | 0001110110 | 118 | 0 | | | |
| 119 | 0001110111 | 119 | 2 | 0001110100 | 116 | −2 |
| 120 | 1001111000 | 632 | 0 | | | |
| 121 | 0001111001 | 121 | 0 | | | |
| 122 | 0001111010 | 122 | 0 | | | |
| 123 | 0001111011 | 123 | 2 | 0001111000 | 120 | −2 |
| 124 | 0001111100 | 124 | 0 | | | |
| 125 | 0001111101 | 125 | 2 | 0001100011 | 99 | −2 |
| 126 | 0001111110 | 126 | 2 | 0001101001 | 105 | −2 |
| 127 | 1001111110 | 638 | 4 | 0001010110 | 86 | −2 |
| 128 | 1011011101 | 733 | 4 | 1010101000 | 680 | −2 |
| 129 | 1011111001 | 761 | 4 | 1010100001 | 705 | −2 |
| 130 | 1011001011 | 715 | 2 | 1011000010 | 706 | −2 |
| 131 | 1011100011 | 739 | 2 | 1010000011 | 643 | −2 |
| 132 | 1010010111 | 663 | 2 | 1011000100 | 708 | −2 |
| 133 | 1011100101 | 741 | 2 | 1010000101 | 645 | −2 |
| 134 | 1011000111 | 711 | 2 | 1010000110 | 646 | −2 |
| 135 | 1010000111 | 647 | 0 | | | |
| 136 | 1011001101 | 717 | 2 | 1000000111 | 519 | −2 |
| 137 | 1010111001 | 697 | 2 | 0010001001 | 137 | −4 |
| 138 | 1010101110 | 686 | 2 | 0010001010 | 138 | −4 |

TABLE 2-continued

Code table

| 9B (decimal) | 10B Binary | Decimal | Operation difference value | 10B Binary | Decimal | Operation difference value |
|---|---|---|---|---|---|---|
| 139 | 1010001011 | 651 | 0 | | | |
| 140 | 1011001110 | 718 | 2 | 0010001100 | 140 | −4 |
| 141 | 1010001101 | 653 | 0 | | | |
| 142 | 1010001110 | 654 | 0 | | | |
| 143 | 0010001111 | 143 | 0 | | | |
| 144 | 1011010011 | 723 | 2 | 1000001011 | 523 | −2 |
| 145 | 1011011001 | 729 | 2 | 0010010001 | 145 | −4 |
| 146 | 1011011010 | 730 | 2 | 0010010010 | 146 | −4 |
| 147 | 1010010011 | 659 | 0 | | | |
| 148 | 1011010110 | 726 | 2 | 0010010100 | 148 | −4 |
| 149 | 1010010101 | 661 | 0 | | | |
| 150 | 1010010110 | 662 | 0 | | | |
| 151 | 0010010111 | 151 | 0 | | | |
| 152 | 1011011100 | 732 | 2 | 0010011000 | 152 | −4 |
| 153 | 1010011001 | 665 | 0 | | | |
| 154 | 1010011010 | 666 | 0 | | | |
| 155 | 0010011011 | 155 | 0 | | | |
| 156 | 1010011100 | 668 | 0 | | | |
| 157 | 0010011101 | 157 | 0 | | | |
| 158 | 0010011110 | 158 | 0 | | | |
| 159 | 1010011101 | 669 | 2 | 0010001011 | 139 | −2 |
| 160 | 1010101101 | 685 | 2 | 0010000111 | 135 | −2 |
| 161 | 1011101001 | 745 | 2 | 0010100001 | 161 | −4 |
| 162 | 1010111010 | 698 | 2 | 0010100010 | 162 | −4 |
| 163 | 1010100011 | 675 | 0 | | | |
| 164 | 1010110110 | 694 | 2 | 0010100100 | 164 | −4 |
| 165 | 1010100101 | 677 | 0 | | | |
| 166 | 1010100110 | 678 | 0 | | | |
| 167 | 0010100111 | 167 | 0 | | | |
| 168 | 1011101010 | 746 | 2 | 1010001000 | 648 | −4 |
| 169 | 1010101001 | 681 | 0 | | | |
| 170 | 1010101010 | 682 | 0 | | | |
| 171 | 0010101011 | 171 | 0 | | | |
| 172 | 1010101100 | 684 | 0 | | | |
| 173 | 0010101101 | 173 | 0 | | | |
| 174 | 0010101110 | 174 | 0 | | | |
| 175 | 0010101111 | 175 | 2 | 0010101100 | 172 | −2 |
| 176 | 1010111100 | 700 | 2 | 0010101000 | 168 | −4 |
| 177 | 1010110001 | 689 | 0 | | | |
| 178 | 1010110010 | 690 | 0 | | | |
| 179 | 0010110011 | 179 | 0 | | | |
| 180 | 1010110100 | 692 | 0 | | | |
| 181 | 0010110101 | 181 | 0 | | | |
| 182 | 0010110110 | 182 | 0 | | | |
| 183 | 0010110111 | 183 | 2 | 0010110100 | 180 | −2 |
| 184 | 1010111000 | 696 | 0 | | | |
| 185 | 0010111001 | 185 | 0 | | | |
| 186 | 0010111010 | 186 | 0 | | | |
| 187 | 0010111011 | 187 | 2 | 0010111000 | 184 | −2 |
| 188 | 0010111100 | 188 | 0 | | | |
| 189 | 0010111101 | 189 | 2 | 0010100011 | 163 | −2 |
| 190 | 0010111110 | 190 | 2 | 0010100101 | 165 | −2 |
| 191 | 1010111101 | 701 | 4 | 0010110001 | 177 | −2 |
| 192 | 1011010101 | 725 | 2 | 0001001011 | 75 | −2 |
| 193 | 1011110001 | 753 | 2 | 0011000001 | 193 | −4 |
| 194 | 1011110010 | 754 | 2 | 0011000010 | 194 | −4 |
| 195 | 1011000011 | 707 | 0 | | | |
| 196 | 1011100110 | 742 | 2 | 0011000100 | 196 | −4 |
| 197 | 1011000101 | 709 | 0 | | | |
| 198 | 1011000110 | 710 | 0 | | | |
| 199 | 0011000111 | 199 | 0 | | | |
| 200 | 1011101100 | 748 | 2 | 0011001000 | 200 | −4 |
| 201 | 1011001001 | 713 | 0 | | | |
| 202 | 1011001010 | 714 | 0 | | | |
| 203 | 0011001011 | 203 | 0 | | | |
| 204 | 1011001100 | 716 | 0 | | | |
| 205 | 0011001101 | 205 | 0 | | | |
| 206 | 0011001110 | 206 | 0 | | | |
| 207 | 0011001111 | 207 | 2 | 0011001100 | 204 | −2 |
| 208 | 1011110100 | 756 | 2 | 1010010000 | 656 | −4 |
| 209 | 1011010001 | 721 | 0 | | | |
| 210 | 1011010010 | 722 | 0 | | | |
| 211 | 0011010011 | 211 | 0 | | | |
| 212 | 1011010100 | 724 | 0 | | | |
| 213 | 0011010101 | 213 | 0 | | | |

TABLE 2-continued

Code table

| 9B (decimal) | 10B Binary | Decimal | Operation difference value | 10B Binary | Decimal | Operation difference value |
|---|---|---|---|---|---|---|
| 214 | 0011010110 | 214 | 0 | | | |
| 215 | 0011010111 | 215 | 2 | 0011010100 | 212 | −2 |
| 216 | 1011011000 | 728 | 0 | | | |
| 217 | 0011011001 | 217 | 0 | | | |
| 218 | 0011011010 | 218 | 0 | | | |
| 219 | 0011011011 | 219 | 2 | 0011011000 | 216 | −2 |
| 220 | 0011011100 | 220 | 0 | | | |
| 221 | 0011011101 | 221 | 2 | 0011000011 | 195 | −2 |
| 222 | 0011011110 | 222 | 2 | 0010011001 | 153 | −2 |
| 223 | 1011011110 | 734 | 4 | 0010010110 | 150 | −2 |
| 224 | 1011111000 | 760 | 2 | 0010110000 | 176 | −4 |
| 225 | 1011100001 | 737 | 0 | | | |
| 226 | 1011100010 | 738 | 0 | | | |
| 227 | 0011100011 | 227 | 0 | | | |
| 228 | 1011100100 | 740 | 0 | | | |
| 229 | 0011100101 | 229 | 0 | | | |
| 230 | 0011100110 | 230 | 0 | | | |
| 231 | 0011100111 | 231 | 2 | 0011100100 | 228 | −2 |
| 232 | 1011101000 | 744 | 0 | | | |
| 233 | 0011101001 | 233 | 0 | | | |
| 234 | 0011101010 | 234 | 0 | | | |
| 235 | 0011101011 | 235 | 2 | 0011101000 | 232 | −2 |
| 236 | 0011101100 | 236 | 0 | | | |
| 237 | 0011101101 | 237 | 2 | 0001010101 | 85 | −2 |
| 238 | 0011101110 | 238 | 2 | 0010101001 | 169 | −2 |
| 239 | 1011101101 | 749 | 4 | 1011001000 | 712 | −2 |
| 240 | 1011110000 | 752 | 0 | | | |
| 241 | 0011110001 | 241 | 0 | | | |
| 242 | 0011110010 | 242 | 0 | | | |
| 243 | 0011110011 | 243 | 2 | 0011100010 | 226 | −2 |
| 244 | 0011110100 | 244 | 0 | | | |
| 245 | 0011110101 | 245 | 2 | 0010010101 | 149 | −2 |
| 246 | 0011110110 | 246 | 2 | 0011000101 | 197 | −2 |
| 247 | 0011110111 | 247 | 4 | 0010100110 | 166 | −2 |
| 248 | 0011111000 | 248 | 0 | | | |
| 249 | 0011111001 | 249 | 2 | 1001000001 | 577 | −4 |
| 250 | 0011111010 | 250 | 2 | 1000001010 | 522 | −4 |
| 251 | 0011111011 | 251 | 4 | 0010101010 | 170 | −2 |
| 252 | 0011111100 | 252 | 2 | 0011001001 | 201 | −2 |
| 253 | 0011111101 | 253 | 4 | 0011100001 | 225 | −2 |
| 254 | 1011101110 | 750 | 4 | 0010110010 | 178 | −2 |
| 255 | 1011010111 | 727 | 4 | 1010010001 | 657 | −2 |
| 256 | 1101110011 | 883 | 4 | 1001110000 | 624 | −2 |
| 257 | 1110111001 | 953 | 4 | 1110000001 | 897 | −2 |
| 258 | 1110101110 | 942 | 4 | 1110000010 | 898 | −2 |
| 259 | 1101100011 | 867 | 2 | 1100000011 | 771 | −2 |
| 260 | 1110110110 | 950 | 4 | 1110000100 | 900 | −2 |
| 261 | 1110100101 | 933 | 2 | 1100000101 | 773 | −2 |
| 262 | 1110000111 | 903 | 2 | 1100000110 | 774 | −2 |
| 263 | 1100000111 | 775 | 0 | | | |
| 264 | 1101111010 | 890 | 4 | 1110001000 | 904 | −2 |
| 265 | 1110001101 | 909 | 2 | 0100001001 | 265 | −4 |
| 266 | 1110001011 | 907 | 2 | 1100001010 | 778 | −2 |
| 267 | 1100001011 | 779 | 0 | | | |
| 268 | 1110001110 | 910 | 2 | 0100001100 | 268 | −4 |
| 269 | 1100001101 | 781 | 0 | | | |
| 270 | 1100001110 | 782 | 0 | | | |
| 271 | 0100001111 | 271 | 0 | | | |
| 272 | 1110111010 | 954 | 4 | 1101010000 | 848 | −2 |
| 273 | 1110011001 | 921 | 2 | 0100010001 | 273 | −4 |
| 274 | 1110011010 | 922 | 2 | 0100010010 | 274 | −4 |
| 275 | 1100010011 | 787 | 0 | | | |
| 276 | 1110010110 | 918 | 2 | 0100010100 | 276 | −4 |
| 277 | 1100010101 | 789 | 0 | | | |
| 278 | 1100010110 | 790 | 0 | | | |
| 279 | 0100010111 | 279 | 0 | | | |
| 280 | 1110011100 | 924 | 2 | 0100011000 | 280 | −4 |
| 281 | 1100011001 | 793 | 0 | | | |
| 282 | 1100011010 | 794 | 0 | | | |
| 283 | 0100011011 | 283 | 0 | | | |
| 284 | 1100011100 | 796 | 0 | | | |
| 285 | 0100011101 | 285 | 0 | | | |
| 286 | 0100011110 | 286 | 0 | | | |
| 287 | 1100011011 | 795 | 2 | 0100011100 | 284 | −2 |
| 288 | 1101111100 | 892 | 4 | 1100110000 | 816 | −2 |

TABLE 2-continued

Code table

| 9B (decimal) | 10B Binary | Decimal | Operation difference value | 10B Binary | Decimal | Operation difference value |
|---|---|---|---|---|---|---|
| 289 | 1110101001 | 937 | 2 | 0100100001 | 289 | −4 |
| 290 | 1110100011 | 931 | 2 | 0100100010 | 290 | −4 |
| 291 | 1100100011 | 803 | 0 | | | |
| 292 | 1100110110 | 822 | 2 | 0100100100 | 292 | −4 |
| 293 | 1100100101 | 805 | 0 | | | |
| 294 | 1100100110 | 806 | 0 | | | |
| 295 | 0100100111 | 295 | 0 | | | |
| 296 | 1110101010 | 938 | 2 | 1000101000 | 552 | −4 |
| 297 | 1100101001 | 809 | 0 | | | |
| 298 | 1100101010 | 810 | 0 | | | |
| 299 | 0100101011 | 299 | 0 | | | |
| 300 | 1100101100 | 812 | 0 | | | |
| 301 | 0100101101 | 301 | 0 | | | |
| 302 | 0100101110 | 302 | 0 | | | |
| 303 | 0100101111 | 303 | 2 | 0100101100 | 300 | −2 |
| 304 | 1100111100 | 828 | 2 | 0100101000 | 296 | −4 |
| 305 | 1100110001 | 817 | 0 | | | |
| 306 | 1100110010 | 818 | 0 | | | |
| 307 | 0100110011 | 307 | 0 | | | |
| 308 | 1100110100 | 820 | 0 | | | |
| 309 | 0100110101 | 309 | 0 | | | |
| 310 | 0100110110 | 310 | 0 | | | |
| 311 | 0100110111 | 311 | 2 | 0100110100 | 308 | −2 |
| 312 | 1100111000 | 824 | 0 | | | |
| 313 | 0100111001 | 313 | 0 | | | |
| 314 | 0100111010 | 314 | 0 | | | |
| 315 | 0100111011 | 315 | 2 | 0100111000 | 312 | −2 |
| 316 | 0100111100 | 316 | 0 | | | |
| 317 | 0100111101 | 317 | 2 | 0100100011 | 291 | −2 |
| 318 | 0100111110 | 318 | 2 | 0100100101 | 293 | −2 |
| 319 | 1100111101 | 829 | 4 | 1000110010 | 562 | −2 |
| 320 | 1101010101 | 853 | 2 | 0100001011 | 267 | −2 |
| 321 | 1101110001 | 881 | 2 | 0101000001 | 321 | −4 |
| 322 | 1101110010 | 882 | 2 | 0101000010 | 322 | −4 |
| 323 | 1101000011 | 835 | 0 | | | |
| 324 | 1101100110 | 870 | 2 | 0101000100 | 324 | −4 |
| 325 | 1101000101 | 837 | 0 | | | |
| 326 | 1101000110 | 838 | 0 | | | |
| 327 | 0101000111 | 327 | 0 | | | |
| 328 | 1101101100 | 876 | 2 | 0101001000 | 328 | −4 |
| 329 | 1101001001 | 841 | 0 | | | |
| 330 | 1101001010 | 842 | 0 | | | |
| 331 | 0101001011 | 331 | 0 | | | |
| 332 | 1101001100 | 844 | 0 | | | |
| 333 | 0101001101 | 333 | 0 | | | |
| 334 | 0101001110 | 334 | 0 | | | |
| 335 | 0101001111 | 335 | 2 | 0101001100 | 332 | −2 |
| 336 | 1101110100 | 884 | 2 | 1001010000 | 592 | −4 |
| 337 | 1101010001 | 849 | 0 | | | |
| 338 | 1101010010 | 850 | 0 | | | |
| 339 | 0101010011 | 339 | 0 | | | |
| 340 | 1101010100 | 852 | 0 | | | |
| 341 | 0101010101 | 341 | 0 | | | |
| 342 | 0101010110 | 342 | 0 | | | |
| 343 | 0101010111 | 343 | 2 | 0101010100 | 340 | −2 |
| 344 | 1101011000 | 856 | 0 | | | |
| 345 | 0101011001 | 345 | 0 | | | |
| 346 | 0101011010 | 346 | 0 | | | |
| 347 | 0101011011 | 347 | 2 | 0101011000 | 344 | −2 |
| 348 | 0101011100 | 348 | 0 | | | |
| 349 | 0101011101 | 349 | 2 | 0101000011 | 323 | −2 |
| 350 | 0101011110 | 350 | 2 | 0001011001 | 89 | −2 |
| 351 | 1101011101 | 861 | 4 | 0001011010 | 90 | −2 |
| 352 | 1101111000 | 888 | 2 | 0001110000 | 112 | −4 |
| 353 | 1101100001 | 865 | 0 | | | |
| 354 | 1101100010 | 866 | 0 | | | |
| 355 | 0101100011 | 355 | 0 | | | |
| 356 | 1101100100 | 868 | 0 | | | |
| 357 | 0101100101 | 357 | 0 | | | |
| 358 | 0101100110 | 358 | 0 | | | |
| 359 | 0101100111 | 359 | 2 | 0101100100 | 356 | −2 |
| 360 | 1101101000 | 872 | 0 | | | |
| 361 | 0101101001 | 361 | 0 | | | |
| 362 | 0101101010 | 362 | 0 | | | |
| 363 | 0101101011 | 363 | 2 | 0101101000 | 360 | −2 |

TABLE 2-continued

Code table

| 9B (decimal) | 10B Binary | Decimal | Operation difference value | 10B Binary | Decimal | Operation difference value |
|---|---|---|---|---|---|---|
| 364 | 0101101100 | 364 | 0 | | | |
| 365 | 0101101101 | 365 | 2 | 0001001101 | 77 | −2 |
| 366 | 0101101110 | 366 | 2 | 0101001001 | 329 | −2 |
| 367 | 1101101011 | 875 | 4 | 0001001110 | 78 | −2 |
| 368 | 1101110000 | 880 | 0 | | | |
| 369 | 0101110001 | 369 | 0 | | | |
| 370 | 0101110010 | 370 | 0 | | | |
| 371 | 0101110011 | 371 | 2 | 0101100010 | 354 | −2 |
| 372 | 0101110100 | 372 | 0 | | | |
| 373 | 0101110101 | 373 | 2 | 0001100101 | 101 | −2 |
| 374 | 0101110110 | 374 | 2 | 0001000110 | 70 | −4 |
| 375 | 0101110111 | 375 | 4 | 0001100110 | 102 | −2 |
| 376 | 0101111000 | 376 | 0 | | | |
| 377 | 0101111001 | 377 | 2 | 1001001001 | 585 | −2 |
| 378 | 0101111010 | 378 | 2 | 1001000010 | 578 | −4 |
| 379 | 0101111011 | 379 | 4 | 0001101010 | 106 | −2 |
| 380 | 0101111100 | 380 | 2 | 1001000100 | 580 | −4 |
| 381 | 0101111101 | 381 | 4 | 0101010001 | 337 | −2 |
| 382 | 1101011110 | 862 | 4 | 0001110010 | 114 | −2 |
| 383 | 1101010111 | 855 | 4 | 1001100001 | 609 | −2 |
| 384 | 1110111100 | 956 | 4 | 1110010000 | 912 | −2 |
| 385 | 1110110001 | 945 | 2 | 1100000001 | 769 | −4 |
| 386 | 1110110010 | 946 | 2 | 1100000010 | 770 | −4 |
| 387 | 1110000011 | 899 | 0 | | | |
| 388 | 1110100110 | 934 | 2 | 1100000100 | 772 | −4 |
| 389 | 1110000101 | 901 | 0 | | | |
| 390 | 1110000110 | 902 | 0 | | | |
| 391 | 0110000111 | 391 | 0 | | | |
| 392 | 1110101100 | 940 | 2 | 1100001000 | 776 | −4 |
| 393 | 1110001001 | 905 | 0 | | | |
| 394 | 1110001010 | 906 | 0 | | | |
| 395 | 0110001011 | 395 | 0 | | | |
| 396 | 1110001100 | 908 | 0 | | | |
| 397 | 0110001101 | 397 | 0 | | | |
| 398 | 0110001110 | 398 | 0 | | | |
| 399 | 0110001111 | 399 | 2 | 0110001100 | 396 | −2 |
| 400 | 1110110100 | 948 | 2 | 1100010000 | 784 | −4 |
| 401 | 1110010001 | 913 | 0 | | | |
| 402 | 1110010010 | 914 | 0 | | | |
| 403 | 0110010011 | 403 | 0 | | | |
| 404 | 1110010100 | 916 | 0 | | | |
| 405 | 0110010101 | 405 | 0 | | | |
| 406 | 0110010110 | 406 | 0 | | | |
| 407 | 0110010111 | 407 | 2 | 0110010100 | 404 | −2 |
| 408 | 1110011000 | 920 | 0 | | | |
| 409 | 0110011001 | 409 | 0 | | | |
| 410 | 0110011010 | 410 | 0 | | | |
| 411 | 0110011011 | 411 | 2 | 0110010010 | 402 | −2 |
| 412 | 0110011100 | 412 | 0 | | | |
| 413 | 0110011101 | 413 | 2 | 0110000011 | 387 | −2 |
| 414 | 0110011110 | 414 | 2 | 0100011001 | 281 | −2 |
| 415 | 1110011101 | 925 | 4 | 0010011010 | 154 | −2 |
| 416 | 1110111000 | 952 | 2 | 0100110000 | 304 | −4 |
| 417 | 1110100001 | 929 | 0 | | | |
| 418 | 1110100010 | 930 | 0 | | | |
| 419 | 0110100011 | 419 | 0 | | | |
| 420 | 1110100100 | 932 | 0 | | | |
| 421 | 1110100101 | 421 | 0 | | | |
| 422 | 0110100110 | 422 | 0 | | | |
| 423 | 0110100111 | 423 | 2 | 0110100100 | 420 | −2 |
| 424 | 1110101000 | 936 | 0 | | | |
| 425 | 1110101001 | 425 | 0 | | | |
| 426 | 0110101010 | 426 | 0 | | | |
| 427 | 0110101011 | 427 | 2 | 0110001010 | 394 | −2 |
| 428 | 0110101100 | 428 | 0 | | | |
| 429 | 0110101101 | 429 | 2 | 0010001101 | 141 | −2 |
| 430 | 0110101110 | 430 | 2 | 0100101001 | 297 | −2 |
| 431 | 1110100111 | 935 | 4 | 0010001110 | 142 | −2 |
| 432 | 1110110000 | 944 | 0 | | | |
| 433 | 0110110001 | 433 | 0 | | | |
| 434 | 0110110010 | 434 | 0 | | | |
| 435 | 0110110011 | 435 | 2 | 0110100010 | 418 | −2 |
| 436 | 0110110100 | 436 | 0 | | | |
| 437 | 0110110101 | 437 | 2 | 0100010101 | 277 | −2 |
| 438 | 0110110110 | 438 | 2 | 1000000110 | 518 | −4 |

TABLE 2-continued

Code table

| 9B (decimal) | 10B Binary | Decimal | Operation difference value | 10B Binary | Decimal | Operation difference value |
| --- | --- | --- | --- | --- | --- | --- |
| 439 | 0110110111 | 439 | 4 | 0100100110 | 294 | −2 |
| 440 | 0110111000 | 440 | 0 | | | |
| 441 | 0110111001 | 441 | 2 | 1010000001 | 641 | −4 |
| 442 | 0110111010 | 442 | 2 | 1010000010 | 642 | −4 |
| 443 | 0110111011 | 443 | 4 | 0100101010 | 298 | −2 |
| 444 | 0110111100 | 444 | 2 | 1010000100 | 644 | −4 |
| 445 | 0110111101 | 445 | 4 | 0100110001 | 305 | −2 |
| 446 | 1010111110 | 702 | 4 | 0100110010 | 306 | −2 |
| 447 | 1100110111 | 823 | 4 | 1000011010 | 538 | −2 |
| 448 | 0111101010 | 490 | 2 | 0011010000 | 208 | −4 |
| 449 | 0111110001 | 497 | 2 | 0110000001 | 385 | −4 |
| 450 | 0111110010 | 498 | 2 | 0110000010 | 386 | −4 |
| 451 | 0111000011 | 451 | 0 | | | |
| 452 | 0111011100 | 476 | 2 | 0110000100 | 388 | −4 |
| 453 | 0111000101 | 453 | 0 | | | |
| 454 | 0111000110 | 454 | 0 | | | |
| 455 | 0111000111 | 455 | 2 | 0111000100 | 452 | −2 |
| 456 | 0111101100 | 492 | 2 | 0110001000 | 392 | −4 |
| 457 | 0111001001 | 457 | 0 | | | |
| 458 | 0111001010 | 458 | 0 | | | |
| 459 | 0111001011 | 459 | 2 | 0111000010 | 450 | −2 |
| 460 | 0111001100 | 460 | 0 | | | |
| 461 | 0111001101 | 461 | 2 | 0100001101 | 269 | −2 |
| 462 | 0111001110 | 462 | 2 | 0110001001 | 393 | −2 |
| 463 | 1110001111 | 911 | 4 | 0100001110 | 270 | −2 |
| 464 | 0111110100 | 500 | 2 | 0101010000 | 336 | −4 |
| 465 | 0111010001 | 465 | 0 | | | |
| 466 | 0111010010 | 466 | 0 | | | |
| 467 | 0111010011 | 467 | 2 | 0010010011 | 147 | −2 |
| 468 | 0111010100 | 468 | 0 | | | |
| 469 | 0111010101 | 469 | 2 | 0101000101 | 325 | −2 |
| 470 | 0111010110 | 470 | 2 | 0010000110 | 134 | −4 |
| 471 | 0111010111 | 471 | 4 | 0100010110 | 278 | −2 |
| 472 | 0111011000 | 472 | 0 | | | |
| 473 | 0111011001 | 473 | 2 | 1010001001 | 649 | −2 |
| 474 | 0111011010 | 474 | 2 | 0100001010 | 266 | −4 |
| 475 | 0111011011 | 475 | 4 | 0100011010 | 282 | −2 |
| 476 | 0111011110 | 478 | 4 | 0110011000 | 408 | −2 |
| 477 | 0111011101 | 477 | 4 | 0110010001 | 401 | −2 |
| 478 | 1110011110 | 926 | 4 | 0001011100 | 92 | −2 |
| 479 | 1110010111 | 919 | 4 | 1001001100 | 588 | −2 |
| 480 | 0111111000 | 504 | 2 | 0110010000 | 400 | −4 |
| 481 | 0111100001 | 481 | 0 | | | |
| 482 | 0111100010 | 482 | 0 | | | |
| 483 | 0111100011 | 483 | 2 | 0100010011 | 275 | −2 |
| 484 | 0111100100 | 484 | 0 | | | |
| 485 | 0111100101 | 485 | 2 | 0110000101 | 389 | −2 |
| 486 | 0111100110 | 486 | 2 | 0100000110 | 262 | −4 |
| 487 | 0111100111 | 487 | 4 | 0011000110 | 198 | −2 |
| 488 | 0111101000 | 488 | 0 | | | |
| 489 | 0111101001 | 489 | 2 | 1100001001 | 777 | −2 |
| 490 | 0111101011 | 491 | 4 | 0110101000 | 424 | −2 |
| 491 | 1110101011 | 939 | 4 | 0011001010 | 202 | −2 |
| 492 | 0111101110 | 494 | 4 | 0111001000 | 456 | −2 |
| 493 | 1101101101 | 877 | 4 | 0101100001 | 353 | −2 |
| 494 | 1101101110 | 878 | 4 | 0101001010 | 330 | −2 |
| 495 | 1101001111 | 847 | 4 | 1010001100 | 652 | −2 |
| 496 | 0111110000 | 496 | 0 | | | |
| 497 | 0111111001 | 505 | 4 | 0011110000 | 240 | −2 |
| 498 | 0111111010 | 506 | 4 | 0101110000 | 368 | −2 |
| 499 | 0111110011 | 499 | 4 | 0011010001 | 209 | −2 |
| 500 | 0111110110 | 502 | 4 | 0110110000 | 432 | −2 |
| 501 | 0111101101 | 493 | 4 | 0110100001 | 417 | −2 |
| 502 | 0011111110 | 254 | 4 | 0011010010 | 210 | −2 |
| 503 | 1011100111 | 743 | 4 | 1001010010 | 594 | −2 |
| 504 | 0111111100 | 508 | 4 | 0111010000 | 464 | −2 |
| 505 | 0111110101 | 501 | 4 | 0111000001 | 449 | −2 |
| 506 | 0101111110 | 382 | 4 | 0101010010 | 338 | −2 |
| 507 | 1001111011 | 635 | 4 | 1010010010 | 658 | −2 |
| 508 | 0110111110 | 446 | 4 | 0010011100 | 156 | −2 |
| 509 | 1010111011 | 699 | 4 | 0001110001 | 113 | −2 |
| 510 | 1011011011 | 731 | 4 | 1001010100 | 596 | −2 |
| 511 | 1001110111 | 631 | 4 | 1000110001 | 561 | −2 |

The line coding provided herein is applicable to the traditional coding and decoding methods based on table search. Further, a line coding method is provided in an embodiment of the present invention.

The line coding method in this embodiment performs coding by searching the code table generated in the foregoing embodiment. The method includes:

performing 9B10B line coding for every 9-bit source data according to a current operation difference value of line coding, where the line coding is implemented by searching a code table, and the code table is shown in Table 2;

calculating the coded operation difference value; and judging whether the coded operation difference value is greater than a preset value, and if the coded operation difference value is greater than the preset value, using the 10-bit sequence obtained through complementing the 10-bit codeword as the coding result corresponding to the 9-bit source data, where a judgment needs to be made about whether the operation difference value exceeds the maximum allowed amplitude.

Figure 3:
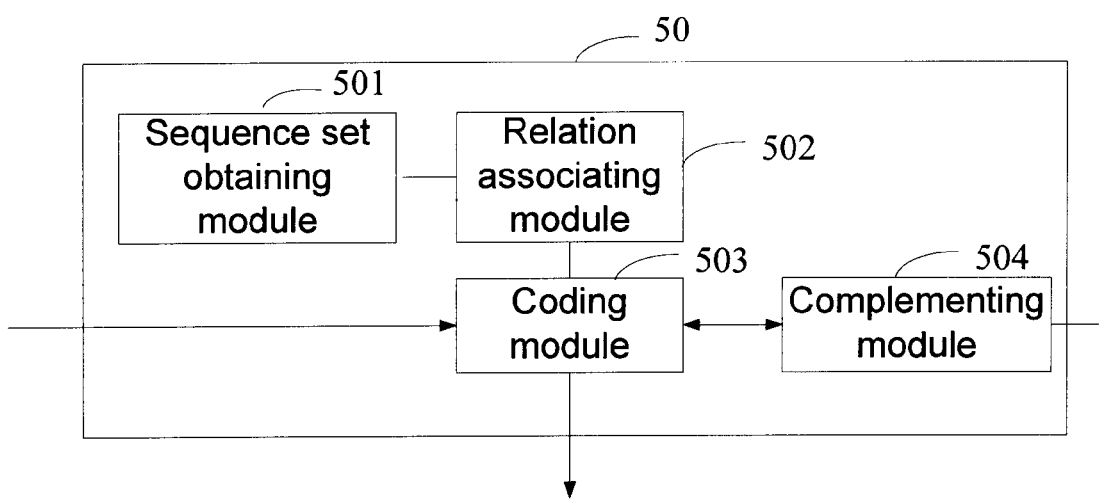
FIG. 3 shows a structure of a convolutional line coder according to an embodiment of the present invention.

As shown in FIG. 3, a convolutional line coder is provided in an embodiment of the present invention. The coder 50 includes:

a sequence set obtaining module 501, configured to construct a sequence set, where the length of each sequence is n bits;

a relation associating module 502, configured to: select a balanced sequence in the sequence set, and obtain source data of n−1 bits corresponding to the balanced sequence; perform Hamming distance detection for the unbalanced sequence in the sequence set to obtain source data of n−1 bits corresponding to the unbalanced sequence; sort the balanced sequence and the unbalanced sequence according to an operation difference value, and generate a code table, where the source data of n−1 bits correspond to the sequence of n bits, and the code table is designed for line coding; and at time of encoding the source data of n−1 bits, obtain a coding result of n bits according to a mapping relation in the code table, where the relation associating module obtains the source data of n−1 bits corresponding to the balanced sequence by deleting the first bit or the last bit; and a coding module 503, configured to: sort the balanced sequence and the unbalanced sequence according to the operation difference value, and generate a code table, where the source data of n−1 bits corresponds to the sequence of n bits; at the time of encoding the source data of n−1 bits, obtain the coding result of n bits according to the mapping relation in the code table.

The coding module 503 is further configured to calculate the coded operation difference value.

The coder 50 further includes a complementing module 504, configured to use the n-bit sequence obtained through complementing the n-bit codeword as the coding result corresponding to the source data of n−1 bits if the coded operation difference value is greater than a preset value. The coder 50 may further include a comparing module, which is configured to check whether the coded operation difference value is greater than a preset value. The comparing module may be independent of or combined with the coding module 503 or complementing module 504.

Persons of ordinary skill in the art may understand that all or a part of the steps of the method according to the embodiments of the present invention may be implemented by a program instructing relevant hardware. The program may be stored in a computer readable storage medium, such as a Read-Only Memory (ROM), a Random Access Memory (RAM) a magnetic disk or a Compact Disk Read-Only Memory (CD-ROM).

The above descriptions are merely some exemplary embodiments of the present invention, but not intended to limit the scope of the present invention. Any modifications, variations or replacement that can be easily derived by those skilled in the art should fall within the scope of the present invention. Therefore, the protection scope of the present invention is subject to the appended claims.

What is claimed is:

1. A convolutional line coding method, comprising:
constructing a sequence set, wherein a length of each sequence in the sequence set is n bits, and wherein n is a natural number greater than 1;
determining an operation difference value for each sequence in the sequence set, wherein the operation difference value for each sequence in the set comprises a difference between a number of bits in the sequence having values of 0 and number of bits in the sequence having values of 1;
identifying balanced sequences in the sequence set, wherein the operation difference value for each of the balanced sequences is equal to zero;
obtaining for each of the balanced sequences source data of n−1 bits corresponding to the balanced sequence;
identifying unbalanced sequences in the sequence set, wherein the operation difference value for each of the unbalanced sequences is not equal to zero;
performing a Hamming distance detection for each of the unbalanced sequences in the sequence set to obtain source data of n−1 bits corresponding to each of the unbalanced sequences, wherein the Hamming distance is calculated between each of the unbalanced sequences and multiple sequences of n−1 bits, and wherein the source data of n−1 bits is selected for each of the unbalanced sequences from the multiple sequences of n−1 bits based at least in part on the source data of n−1 bits and the unbalanced sequence having a minimum Hamming distance;
sorting the balanced sequences and the unbalanced sequences according to the operation difference values;
generating a code table, wherein the code table comprises a number of entries, wherein each entry identifies one of the sequences of n bits and its corresponding source of n−1 bits; and
obtaining a coding result comprising one of the sequences of n bits according to a mapping relation in the code table.

2. The method of claim 1, wherein obtaining for each of the balanced sequences source data of n−1 bits corresponding to the balanced sequence comprises: deleting a first bit or a last bit in the balanced sequence to obtain the source data of n−1 bits corresponding to the balanced sequence.

3. The method of claim 1, wherein each of the balanced sequences in the sequence set comprises a 10-bit balanced sequence, and wherein the sequence set comprises a sequence composed of six 1s and four 0s, a sequence composed of six 0s and four 1s, a sequence composed of seven 1s and three 0s, and a sequence composed of seven 0s and three 1s.

4. The method of claim 3, wherein at least some of the sequences in the sequence set are selected as 10-bit sequences according to the number of continuous 0s or continuous 1s in the sequences.

5. The method of claim 3, wherein for each of the balanced sequences, a first bit or a last bit of each 10-bit sequence is deleted to obtain 9 bits, which comprise 9 bit source data corresponding to a 10-bit codework, and wherein for each of the unbalanced sequences, the Hamming distance is calculated between 9 bit source data and a 10-bit sequence.

6. The method of claim 5, wherein the sequences are sorted according to the operation difference values to generate a 9B10B code table corresponding to each operation difference value, and wherein the operation difference values include −4, −2, 0, 2, and 4.

7. A convolutional line coder comprising:
a sequence set obtaining module configured to construct a sequence set-set and determine an operation difference value for each sequence in the sequence set, wherein a length of each sequence in the sequence set is n bits, and wherein the operation difference value for each sequence in the sequence set comprises a difference between a number of bits in the sequence having values of 0 and a number of bits in the sequence having values of 1;
a relation associating module configured to:
  select a balanced sequence in the sequence set, wherein the operation difference value of the balanced sequence is equal to zero;
  obtain source data of n−1 bits corresponding to the balanced sequence;
  perform a Hamming distance detection for an unbalanced sequence in the sequence set to obtain source data of n−1 bits corresponding to the unbalanced sequence, wherein the operation difference value of the unbalanced sequence is net equal to zero, wherein the Hamming distance is calculated between the unbalanced sequence in the unbalanced sequence in the sequence set and multiple sequences of n−1 bits, and wherein the source data of n−1 bits is selected from the multiple sequences of n−1 bits based at least in part on the source data distance; and
a coding module configured to:
  sort the balanced sequence and the unbalanced sequence according to the operation difference values to generate a code table; and
  use the code table to obtain a coding result of n bits according to a mapping relation in the code table.

8. The coder of claim 7, wherein the relation associating module is configured to obtain the source data of n−1 bits corresponding to the balanced sequence by deleting a first bit or a last bit.

9. The coder of claim 7, further comprising a complementing module, configured to use an n-bit sequence obtained through complementing an n-bit codeword as a coding result corresponding to the source data of n−1 bits when a coded operation difference value is greater than a preset value.

10. A coding method comprising:
performing 9B10B line coding for every 9-bit source data according to a current operation difference value of line coding, wherein each line coding corresponds to a 10-bit sequence, wherein the current operation difference value of each line coding is calculated as a difference between a number of bits in the corresponding 10-bit sequence having values of 0 and a number of bits in the corresponding 10-hit sequence having values of 1, wherein a code table is searched for the 10-bit sequences, and wherein the line coding is implemented according to the following code table:

| 9B (decimal) | 10B Binary | Decimal | Operation difference value | 10B Binary | Decimal | Operation difference value |
|---|---|---|---|---|---|---|
| 0 | 1010110111 | 695 | 4 | 1001010001 | 593 | −2 |
| 1 | 1100111011 | 827 | 4 | 1010100001 | 673 | −2 |
| 2 | 1101011011 | 859 | 4 | 1001100010 | 610 | −2 |
| 3 | 1110110011 | 947 | 4 | 1010100010 | 674 | −2 |
| 4 | 1101100111 | 871 | 4 | 1010010100 | 660 | −2 |
| 5 | 1011110101 | 757 | 4 | 1010100100 | 676 | −2 |
| 6 | 1011110110 | 758 | 4 | 0101000110 | 326 | −2 |
| 7 | 1010100111 | 679 | 2 | 0110000110 | 390 | −2 |
| 8 | 1011101011 | 747 | 4 | 1001011000 | 600 | −2 |
| 9 | 1110101101 | 941 | 4 | 1101001000 | 840 | −2 |
| 10 | 1001001111 | 591 | 2 | 1001001010 | 586 | −2 |
| 11 | 1101001011 | 843 | 2 | 1010001010 | 650 | −2 |
| 12 | 1010001111 | 655 | 2 | 1100001100 | 780 | −2 |
| 13 | 1101001101 | 845 | 2 | 1000001101 | 525 | −2 |
| 14 | 1100001111 | 783 | 2 | 1000001110 | 526 | −2 |
| 15 | 1000001111 | 527 | 0 | | | |
| 16 | 1110011011 | 923 | 4 | 1010011000 | 664 | −2 |
| 17 | 1101110101 | 885 | 4 | 1100010001 | 785 | −2 |
| 18 | 1001011011 | 603 | 2 | 1100010010 | 786 | −2 |
| 19 | 1110010011 | 915 | 2 | 1000010011 | 531 | −2 |
| 20 | 1001010111 | 599 | 2 | 1100010100 | 788 | −2 |
| 21 | 1110010101 | 917 | 2 | 1000010101 | 533 | −2 |
| 22 | 1100010111 | 791 | 2 | 1000010110 | 534 | −2 |
| 23 | 1000010111 | 535 | 0 | | | |
| 24 | 1010011011 | 667 | 2 | 1100011000 | 792 | −2 |
| 25 | 1100011101 | 797 | 2 | 1000010001 | 529 | −4 |
| 26 | 1001011110 | 606 | 2 | 1000010010 | 530 | −4 |
| 27 | 1000011011 | 539 | 0 | | | |
| 28 | 1010011110 | 670 | 2 | 1000010100 | 532 | −4 |
| 29 | 1000011101 | 541 | 0 | | | |
| 30 | 1000011110 | 542 | 0 | | | |
| 31 | 1100011110 | 798 | 2 | 1000011001 | 537 | −2 |
| 32 | 1011110011 | 755 | 4 | 1001100100 | 612 | −2 |
| 33 | 1110110101 | 949 | 4 | 1100100001 | 801 | −2 |

-continued

Code table

| 9B (decimal) | 10B Binary | Decimal | Operation difference value | 10B Binary | Decimal | Operation difference value |
|---|---|---|---|---|---|---|
| 34 | 1011111010 | 762 | 4 | 1100100010 | 802 | −2 |
| 35 | 1010110011 | 691 | 2 | 1000100011 | 547 | −2 |
| 36 | 1101110110 | 886 | 4 | 1100100100 | 804 | −2 |
| 37 | 1010110101 | 693 | 2 | 1000100101 | 549 | −2 |
| 38 | 1100100111 | 807 | 2 | 1000100110 | 550 | −2 |
| 39 | 1000100111 | 551 | 0 | | | |
| 40 | 1010101011 | 683 | 2 | 1100101000 | 808 | −2 |
| 41 | 1100101101 | 813 | 2 | 1000001001 | 521 | −4 |
| 42 | 1100101011 | 811 | 2 | 1000101010 | 554 | −2 |
| 43 | 1000101011 | 555 | 0 | | | |
| 44 | 1100101110 | 814 | 2 | 1000001100 | 524 | −4 |
| 45 | 1000101101 | 557 | 0 | | | |
| 46 | 1000101110 | 558 | 0 | | | |
| 47 | 1000101111 | 559 | 2 | 1000101100 | 556 | −2 |
| 48 | 1011111100 | 764 | 4 | 1010110000 | 688 | −2 |
| 49 | 1100111001 | 825 | 2 | 1000100001 | 545 | −4 |
| 50 | 1100110011 | 819 | 2 | 1000100010 | 546 | −4 |
| 51 | 1000110011 | 563 | 0 | 1000110011 | 563 | 0 |
| 52 | 1100110101 | 821 | 2 | 1000100100 | 548 | −4 |
| 53 | 1000110101 | 565 | 0 | | | |
| 54 | 1000110110 | 566 | 0 | | | |
| 55 | 1000110111 | 567 | 2 | 1000110100 | 564 | −2 |
| 56 | 1100111010 | 826 | 2 | 1000011000 | 536 | −4 |
| 57 | 1000111001 | 569 | 0 | | | |
| 58 | 1000111010 | 570 | 0 | | | |
| 59 | 1000111011 | 571 | 2 | 1000111000 | 568 | −2 |
| 60 | 1000111100 | 572 | 0 | | | |
| 61 | 1000111101 | 573 | 2 | 1000101001 | 553 | −2 |
| 62 | 1000111110 | 574 | 2 | 1000110000 | 560 | −4 |
| 63 | 1100111110 | 830 | 4 | 1000011100 | 540 | −2 |
| 64 | 1001111101 | 637 | 4 | 1001101000 | 616 | −2 |
| 65 | 1101111001 | 889 | 4 | 1101000001 | 833 | −2 |
| 66 | 1001101011 | 619 | 2 | 1101000010 | 834 | −2 |
| 67 | 1101010011 | 851 | 2 | 1001000011 | 579 | −2 |
| 68 | 1001100111 | 615 | 2 | 1101000100 | 836 | −2 |
| 69 | 1101100101 | 869 | 2 | 1001000101 | 581 | −2 |
| 70 | 1101000111 | 839 | 2 | 1001000110 | 582 | −2 |
| 71 | 1001000111 | 583 | 0 | | | |
| 72 | 1001101101 | 621 | 2 | 0100000111 | 263 | −2 |
| 73 | 1001111001 | 633 | 2 | 0001001001 | 73 | −4 |
| 74 | 1001101110 | 622 | 2 | 0001001010 | 74 | −4 |
| 75 | 1001001011 | 587 | 0 | | | |
| 76 | 1101001110 | 846 | 2 | 0001001100 | 76 | −4 |
| 77 | 1001001101 | 589 | 0 | | | |
| 78 | 1001001110 | 590 | 0 | | | |
| 79 | 0001001111 | 79 | 0 | | | |
| 80 | 1001110011 | 627 | 2 | 1011010000 | 720 | −2 |
| 81 | 1101011001 | 857 | 2 | 0001010001 | 81 | −4 |
| 82 | 1101011010 | 858 | 2 | 0001010010 | 82 | −4 |
| 83 | 1001010011 | 595 | 0 | | | |
| 84 | 1101010110 | 854 | 2 | 0001010100 | 84 | −4 |
| 85 | 1001010101 | 597 | 0 | | | |
| 86 | 1001010110 | 598 | 0 | | | |
| 87 | 0001010111 | 87 | 0 | | | |
| 88 | 1101011100 | 860 | 2 | 0001011000 | 88 | −4 |
| 89 | 1001011001 | 601 | 0 | | | |
| 90 | 1001011010 | 602 | 0 | | | |
| 91 | 0001011011 | 91 | 0 | | | |
| 92 | 1001011100 | 604 | 0 | | | |
| 93 | 0001011101 | 93 | 0 | | | |
| 94 | 0001011110 | 94 | 0 | | | |
| 95 | 1001011101 | 605 | 2 | 0001010011 | 83 | −2 |
| 96 | 1001110101 | 629 | 2 | 0001000111 | 71 | −2 |
| 97 | 1101101001 | 873 | 2 | 0001100001 | 97 | −4 |
| 98 | 1001111010 | 634 | 2 | 0001100010 | 98 | −4 |
| 99 | 1001100011 | 611 | 0 | | | |
| 100 | 1001110110 | 630 | 2 | 0001100100 | 100 | −4 |
| 101 | 1001100101 | 613 | 0 | | | |
| 102 | 1001100110 | 614 | 0 | | | |
| 103 | 0001100111 | 103 | 0 | | | |
| 104 | 1101101010 | 874 | 2 | 1001001000 | 584 | −4 |
| 105 | 1001101001 | 617 | 0 | | | |
| 106 | 1001101010 | 618 | 0 | | | |
| 107 | 0001101011 | 107 | 0 | | | |

-continued

Code table

| 9B (decimal) | 10B Binary | Decimal | Operation difference value | 10B Binary | Decimal | Operation difference value |
|---|---|---|---|---|---|---|
| 108 | 1001101100 | 620 | 0 | | | |
| 109 | 0001101101 | 109 | 0 | | | |
| 110 | 0001101110 | 110 | 0 | | | |
| 111 | 0001101111 | 111 | 2 | 0001101100 | 108 | −2 |
| 112 | 1001111100 | 636 | 2 | 0001101000 | 104 | −4 |
| 113 | 1001110001 | 625 | 0 | | | |
| 114 | 1001110010 | 626 | 0 | | | |
| 115 | 0001110011 | 115 | 0 | | | |
| 116 | 1001110100 | 628 | 0 | | | |
| 117 | 0001110101 | 117 | 0 | | | |
| 118 | 0001110110 | 118 | 0 | | | |
| 119 | 0001110111 | 119 | 2 | 0001110100 | 116 | −2 |
| 120 | 1001111000 | 632 | 0 | | | |
| 121 | 0001111001 | 121 | 0 | | | |
| 122 | 0001111010 | 122 | 0 | | | |
| 123 | 0001111011 | 123 | 2 | 0001111000 | 120 | −2 |
| 124 | 0001111100 | 124 | 0 | | | |
| 125 | 0001111101 | 125 | 2 | 0001100011 | 99 | −2 |
| 126 | 0001111110 | 126 | 2 | 0001101001 | 105 | −2 |
| 127 | 1001111110 | 638 | 4 | 0001010110 | 86 | −2 |
| 128 | 1011011101 | 733 | 4 | 1010101000 | 680 | −2 |
| 129 | 1011111001 | 761 | 4 | 1011000001 | 705 | −2 |
| 130 | 1011001011 | 715 | 2 | 1011000010 | 706 | −2 |
| 131 | 1011100011 | 739 | 2 | 1010000011 | 643 | −2 |
| 132 | 1010010111 | 663 | 2 | 1011000100 | 708 | −2 |
| 133 | 1011100101 | 741 | 2 | 1010000101 | 645 | −2 |
| 134 | 1011100111 | 711 | 2 | 1010000110 | 646 | −2 |
| 135 | 1010000111 | 647 | 0 | | | |
| 136 | 1011001101 | 717 | 2 | 1000000111 | 519 | −2 |
| 137 | 1010111001 | 697 | 2 | 0010001001 | 137 | −4 |
| 138 | 1010101110 | 686 | 2 | 0010001010 | 138 | −4 |
| 139 | 1010001011 | 651 | 0 | | | |
| 140 | 1011001110 | 718 | 2 | 0010001100 | 140 | −4 |
| 141 | 1010001101 | 653 | 0 | | | |
| 142 | 1010001110 | 654 | 0 | | | |
| 143 | 0010001111 | 143 | 0 | | | |
| 144 | 1011010011 | 723 | 2 | 1000001011 | 523 | −2 |
| 145 | 1011011001 | 729 | 2 | 0010010001 | 145 | −4 |
| 146 | 1011011010 | 730 | 2 | 0010010010 | 146 | −4 |
| 147 | 1010010011 | 659 | 0 | | | |
| 148 | 1011010110 | 726 | 2 | 0010010100 | 148 | −4 |
| 149 | 1010010101 | 661 | 0 | | | |
| 150 | 1010010110 | 662 | 0 | | | |
| 151 | 0010010111 | 151 | 0 | | | |
| 152 | 1011011100 | 732 | 2 | 0010011000 | 152 | −4 |
| 153 | 1010011001 | 665 | 0 | | | |
| 154 | 1010011010 | 666 | 0 | | | |
| 155 | 0010011011 | 155 | 0 | | | |
| 156 | 1010011100 | 668 | 0 | | | |
| 157 | 0010011101 | 157 | 0 | | | |
| 158 | 0010011110 | 158 | 0 | | | |
| 159 | 1010011101 | 669 | 2 | 0010001011 | 139 | −2 |
| 160 | 1010101101 | 685 | 2 | 0010000111 | 135 | −2 |
| 161 | 1011101001 | 745 | 2 | 0010100001 | 161 | −4 |
| 162 | 1010111010 | 698 | 2 | 0010100010 | 162 | −4 |
| 163 | 1010100011 | 675 | 0 | | | |
| 164 | 1010110110 | 694 | 2 | 0010100100 | 164 | −4 |
| 165 | 1010100101 | 677 | 0 | | | |
| 166 | 1010100110 | 678 | 0 | | | |
| 167 | 0010100111 | 167 | 0 | | | |
| 168 | 1011101010 | 746 | 2 | 1010001000 | 648 | −4 |
| 169 | 1010101001 | 681 | 0 | | | |
| 170 | 1010101010 | 682 | 0 | | | |
| 171 | 0010101011 | 171 | 0 | | | |
| 172 | 1010101100 | 684 | 0 | | | |
| 173 | 0010101101 | 173 | 0 | | | |
| 174 | 0010101110 | 174 | 0 | | | |
| 175 | 0010101111 | 175 | 2 | 0010101100 | 172 | −2 |
| 176 | 1010111100 | 700 | 2 | 0010101000 | 168 | −4 |
| 177 | 1010110001 | 689 | 0 | | | |
| 178 | 1010110010 | 690 | 0 | | | |
| 179 | 0010110011 | 179 | 0 | | | |
| 180 | 1010110100 | 692 | 0 | | | |
| 181 | 0010110101 | 181 | 0 | | | |

-continued

Code table

| 9B (decimal) | 10B Binary | Decimal | Operation difference value | 10B Binary | Decimal | Operation difference value |
|---|---|---|---|---|---|---|
| 182 | 0010110110 | 182 | 0 | | | |
| 183 | 0010110111 | 183 | 2 | 0010110100 | 180 | −2 |
| 184 | 1010111000 | 696 | 0 | | | |
| 185 | 0010111001 | 185 | 0 | | | |
| 186 | 0010111010 | 186 | 0 | | | |
| 187 | 0010111011 | 187 | 2 | 0010111000 | 184 | −2 |
| 188 | 0010111100 | 188 | 0 | | | |
| 189 | 0010111101 | 189 | 2 | 0010100011 | 163 | −2 |
| 190 | 0010111110 | 190 | 2 | 0010100101 | 165 | −2 |
| 191 | 1010111101 | 701 | 4 | 0010110001 | 177 | −2 |
| 192 | 1011010101 | 725 | 2 | 0001001011 | 75 | −2 |
| 193 | 1011110001 | 753 | 2 | 0011000001 | 193 | −4 |
| 194 | 1011110010 | 754 | 2 | 0011000010 | 194 | −4 |
| 195 | 1011000011 | 707 | 0 | | | |
| 196 | 1011100110 | 742 | 2 | 0011000100 | 196 | −4 |
| 197 | 1011000101 | 709 | 0 | | | |
| 198 | 1011000110 | 710 | 0 | | | |
| 199 | 0011000111 | 199 | 0 | | | |
| 200 | 1011101100 | 748 | 2 | 0011001000 | 200 | −4 |
| 201 | 1011001001 | 713 | 0 | | | |
| 202 | 1011001010 | 714 | 0 | | | |
| 203 | 0011001011 | 203 | 0 | | | |
| 204 | 1011001100 | 716 | 0 | | | |
| 205 | 0011001101 | 205 | 0 | | | |
| 206 | 0011001110 | 206 | 0 | | | |
| 207 | 0011001111 | 207 | 2 | 0011001100 | 204 | −2 |
| 208 | 1011110100 | 756 | 2 | 1010010000 | 656 | −4 |
| 209 | 1011010001 | 721 | 0 | | | |
| 210 | 1011010010 | 722 | 0 | | | |
| 211 | 0011010011 | 211 | 0 | | | |
| 212 | 1011010100 | 724 | 0 | | | |
| 213 | 0011010101 | 213 | 0 | | | |
| 214 | 0011010110 | 214 | 0 | | | |
| 215 | 0011010111 | 215 | 2 | 0011010100 | 212 | −2 |
| 216 | 1011011000 | 728 | 0 | | | |
| 217 | 0011011001 | 217 | 0 | | | |
| 218 | 0011011010 | 218 | 0 | | | |
| 219 | 0011011011 | 219 | 2 | 0011011000 | 216 | −2 |
| 220 | 0011011100 | 220 | 0 | | | |
| 221 | 0011011101 | 221 | 2 | 0011000011 | 195 | −2 |
| 222 | 0011011110 | 222 | 2 | 0010011001 | 153 | −2 |
| 223 | 1011011110 | 734 | 4 | 0010010110 | 150 | −2 |
| 224 | 1011111000 | 760 | 2 | 0010110000 | 176 | −4 |
| 225 | 1011100001 | 737 | 0 | | | |
| 226 | 1011100010 | 738 | 0 | | | |
| 227 | 0011100011 | 227 | 0 | | | |
| 228 | 1011100100 | 740 | 0 | | | |
| 229 | 0011100101 | 229 | 0 | | | |
| 230 | 0011100110 | 230 | 0 | | | |
| 231 | 0011100111 | 231 | 2 | 0011100100 | 228 | −2 |
| 232 | 1011101000 | 744 | 0 | | | |
| 233 | 0011101001 | 233 | 0 | | | |
| 234 | 0011101010 | 234 | 0 | | | |
| 235 | 0011101011 | 235 | 2 | 0011101000 | 232 | −2 |
| 236 | 0011101100 | 236 | 0 | | | |
| 237 | 0011101101 | 237 | 2 | 0001010101 | 85 | −2 |
| 238 | 0011101110 | 238 | 2 | 0010101001 | 169 | −2 |
| 239 | 1011101101 | 749 | 4 | 1011001000 | 712 | −2 |
| 240 | 1011110000 | 752 | 0 | | | |
| 241 | 0011110001 | 241 | 0 | | | |
| 242 | 0011110010 | 242 | 0 | | | |
| 243 | 0011110011 | 243 | 2 | 0011100010 | 226 | −2 |
| 244 | 0011110100 | 244 | 0 | | | |
| 245 | 0011110101 | 245 | 2 | 0010010101 | 149 | −2 |
| 246 | 0011110110 | 246 | 2 | 0011000101 | 197 | −2 |
| 247 | 0011110111 | 247 | 4 | 0010100110 | 166 | −2 |
| 248 | 0011111000 | 248 | 0 | | | |
| 249 | 0011111001 | 249 | 2 | 1001000001 | 577 | −4 |
| 250 | 0011111010 | 250 | 2 | 1000001010 | 522 | −4 |
| 251 | 0011111011 | 251 | 4 | 0010101010 | 170 | −2 |
| 252 | 0011111100 | 252 | 2 | 0011001001 | 201 | −2 |
| 253 | 0011111101 | 253 | 4 | 0011100001 | 225 | −2 |
| 254 | 1011101110 | 750 | 4 | 0010110010 | 178 | −2 |
| 255 | 1011010111 | 727 | 4 | 1010010001 | 657 | −2 |

-continued

Code table

| 9B (decimal) | 10B Binary | Decimal | Operation difference value | 10B Binary | Decimal | Operation difference value |
|---|---|---|---|---|---|---|
| 256 | 1101110011 | 883 | 4 | 1001110000 | 624 | −2 |
| 257 | 1110111001 | 953 | 4 | 1110000001 | 897 | −2 |
| 258 | 1110101110 | 942 | 4 | 1110000010 | 898 | −2 |
| 259 | 1101100011 | 867 | 2 | 1100000011 | 771 | −2 |
| 260 | 1110110110 | 950 | 4 | 1110000100 | 900 | −2 |
| 261 | 1110100101 | 933 | 2 | 1100000101 | 773 | −2 |
| 262 | 1110000111 | 903 | 2 | 1100000110 | 774 | −2 |
| 263 | 1100000111 | 775 | 0 | | | |
| 264 | 1101111010 | 890 | 4 | 1110001000 | 904 | −2 |
| 265 | 1110001101 | 909 | 2 | 0100001001 | 265 | −4 |
| 266 | 1110001011 | 907 | 2 | 1100001010 | 778 | −2 |
| 267 | 1100001011 | 779 | 0 | | | |
| 268 | 1110001110 | 910 | 2 | 0100001100 | 268 | −4 |
| 269 | 1100001101 | 781 | 0 | | | |
| 270 | 1100001110 | 782 | 0 | | | |
| 271 | 0100001111 | 271 | 0 | | | |
| 272 | 1110111010 | 954 | 4 | 1101010000 | 848 | −2 |
| 273 | 1110011001 | 921 | 2 | 0100010001 | 273 | −4 |
| 274 | 1110011010 | 922 | 2 | 0100010010 | 274 | −4 |
| 275 | 1100010011 | 787 | 0 | | | |
| 276 | 1110010110 | 918 | 2 | 0100010100 | 276 | −4 |
| 277 | 1100010101 | 789 | 0 | | | |
| 278 | 1100010110 | 790 | 0 | | | |
| 279 | 0100010111 | 279 | 0 | | | |
| 280 | 1110011100 | 924 | 2 | 0100011000 | 280 | −4 |
| 281 | 1100011001 | 793 | 0 | | | |
| 282 | 1100011010 | 794 | 0 | | | |
| 283 | 0100011011 | 283 | 0 | | | |
| 284 | 1100011100 | 796 | 0 | | | |
| 285 | 0100011101 | 285 | 0 | | | |
| 286 | 0100011110 | 286 | 0 | | | |
| 287 | 1100011011 | 795 | 2 | 0100011100 | 284 | −2 |
| 288 | 1101111100 | 892 | 4 | 1100110000 | 816 | −2 |
| 289 | 1110101001 | 937 | 2 | 0100100001 | 289 | −4 |
| 290 | 1110100011 | 931 | 2 | 0100100010 | 290 | −4 |
| 291 | 1100100011 | 803 | 0 | | | |
| 292 | 1100110110 | 822 | 2 | 0100100100 | 292 | −4 |
| 293 | 1100100101 | 805 | 0 | | | |
| 294 | 1100100110 | 806 | 0 | | | |
| 295 | 0100100111 | 295 | 0 | | | |
| 296 | 1110101010 | 938 | 2 | 1000101000 | 552 | −4 |
| 297 | 1100101001 | 809 | | | | |
| 298 | 1100101010 | 810 | 0 | | | |
| 299 | 0100101011 | 299 | 0 | | | |
| 300 | 1100101100 | 812 | 0 | | | |
| 301 | 0100101101 | 301 | 0 | | | |
| 302 | 0100101110 | 302 | 0 | | | |
| 303 | 0100101111 | 303 | 2 | 0100101100 | 300 | −2 |
| 304 | 1100111100 | 828 | 2 | 0100101000 | 296 | −4 |
| 305 | 1100110001 | 817 | 0 | | | |
| 306 | 1100110010 | 818 | 0 | | | |
| 307 | 0100110011 | 307 | 0 | | | |
| 308 | 1100110100 | 820 | 0 | | | |
| 309 | 0100110101 | 309 | 0 | | | |
| 310 | 0100110110 | 310 | 0 | | | |
| 311 | 0100110111 | 311 | 2 | 0100110100 | 308 | −2 |
| 312 | 1100111000 | 824 | 0 | | | |
| 313 | 0100111001 | 313 | 0 | | | |
| 314 | 0100111010 | 314 | 0 | | | |
| 315 | 0100111011 | 315 | 2 | 0100111000 | 312 | −2 |
| 316 | 0100111100 | 316 | 0 | | | |
| 317 | 0100111101 | 317 | 2 | 0100100011 | 291 | −2 |
| 318 | 0100111110 | 318 | 2 | 0100100101 | 293 | −2 |
| 319 | 1100111101 | 829 | 4 | 1000110010 | 562 | −2 |
| 320 | 1101010101 | 853 | 2 | 0100001011 | 267 | −2 |
| 321 | 1101110001 | 881 | 2 | 0101000001 | 321 | −4 |
| 322 | 1101110010 | 882 | 2 | 0101000010 | 322 | −4 |
| 323 | 1101000011 | 835 | 0 | | | |
| 324 | 1101100110 | 870 | 2 | 0101000100 | 324 | −4 |
| 325 | 1101000101 | 837 | 0 | | | |
| 326 | 1101000110 | 838 | 0 | | | |
| 327 | 0101000111 | 327 | 0 | | | |
| 328 | 1101101100 | 876 | 2 | 0101001000 | 328 | −4 |
| 329 | 1101001001 | 841 | 0 | | | |

Code table

| 9B (decimal) | 10B Binary | Decimal | Operation difference value | 10B Binary | Decimal | Operation difference value |
|---|---|---|---|---|---|---|
| 330 | 1101001010 | 842 | 0 | | | |
| 331 | 0101001011 | 331 | 0 | | | |
| 332 | 1101001100 | 844 | 0 | | | |
| 333 | 0101001101 | 333 | 0 | | | |
| 334 | 0101001110 | 334 | 0 | | | |
| 335 | 0101001111 | 335 | 2 | 0101001100 | 332 | −2 |
| 336 | 1101110100 | 884 | 2 | 1001010000 | 592 | −4 |
| 337 | 1101010001 | 849 | 0 | | | |
| 338 | 1101010010 | 850 | 0 | | | |
| 339 | 0101010011 | 339 | 0 | | | |
| 340 | 1101010100 | 852 | 0 | | | |
| 341 | 0101010101 | 341 | 0 | | | |
| 342 | 0101010110 | 342 | 0 | | | |
| 343 | 0101010111 | 343 | 2 | 0101010100 | 340 | −2 |
| 344 | 1101011000 | 856 | 0 | | | |
| 345 | 0101011001 | 345 | 0 | | | |
| 346 | 0101011010 | 346 | 0 | | | |
| 347 | 0101011011 | 347 | 2 | 0101011000 | 344 | −2 |
| 348 | 0101011100 | 348 | 0 | | | |
| 349 | 0101011101 | 349 | 2 | 0101000011 | 323 | −2 |
| 350 | 0101011110 | 350 | 2 | 0001011001 | 89 | −2 |
| 351 | 1101011101 | 861 | 4 | 0001011010 | 90 | −2 |
| 352 | 1101111000 | 888 | 2 | 0001110000 | 112 | −4 |
| 353 | 1101100001 | 865 | 0 | | | |
| 354 | 1101100010 | 866 | 0 | | | |
| 355 | 0101100011 | 355 | 0 | | | |
| 356 | 1101100100 | 868 | 0 | | | |
| 357 | 0101100101 | 357 | 0 | | | |
| 358 | 0101100110 | 358 | 0 | | | |
| 359 | 0101100111 | 359 | 2 | 0101100100 | 356 | −2 |
| 360 | 1101101000 | 872 | 0 | | | |
| 361 | 0101101001 | 361 | 0 | | | |
| 362 | 0101101010 | 362 | 0 | | | |
| 363 | 0101101011 | 363 | 2 | 0101101000 | 360 | −2 |
| 364 | 0101101100 | 364 | 0 | | | |
| 365 | 0101101101 | 365 | 2 | 0001001101 | 77 | −2 |
| 366 | 0101101110 | 366 | 2 | 0101001001 | 329 | −2 |
| 367 | 1101101011 | 875 | 4 | 0001001110 | 78 | −2 |
| 368 | 1101110000 | 880 | 0 | | | |
| 369 | 0101110001 | 369 | 0 | | | |
| 370 | 0101110010 | 370 | 0 | | | |
| 371 | 0101110011 | 371 | 2 | 0101100010 | 354 | −2 |
| 372 | 0101110100 | 372 | 0 | | | |
| 373 | 0101110101 | 373 | 2 | 0001100101 | 101 | −2 |
| 374 | 0101110110 | 374 | 2 | 0001000110 | 70 | −4 |
| 375 | 0101110111 | 375 | 4 | 0001100110 | 102 | −2 |
| 376 | 0101111000 | 376 | 0 | | | |
| 377 | 0101111001 | 377 | 2 | 1001001001 | 585 | −2 |
| 378 | 0101111010 | 378 | 2 | 1001000010 | 578 | −4 |
| 379 | 0101111011 | 379 | 4 | 0001101010 | 106 | −2 |
| 380 | 0101111100 | 380 | 2 | 1001000100 | 580 | −4 |
| 381 | 0101111101 | 381 | 4 | 0101010001 | 337 | −2 |
| 382 | 1101011110 | 862 | 4 | 0001110010 | 114 | −2 |
| 383 | 1101010111 | 855 | 4 | 1001100001 | 609 | −2 |
| 384 | 1110111100 | 956 | 4 | 1110010000 | 912 | −2 |
| 385 | 1110110001 | 945 | 2 | 1100000001 | 769 | −4 |
| 386 | 1110110010 | 946 | 2 | 1100000010 | 770 | −4 |
| 387 | 1110000011 | 899 | 0 | | | |
| 388 | 1110100110 | 934 | 2 | 1100000100 | 772 | −4 |
| 389 | 1110000101 | 901 | 0 | | | |
| 390 | 1110000110 | 902 | 0 | | | |
| 391 | 0110000111 | 391 | 0 | | | |
| 392 | 1110101100 | 940 | 2 | 1100001000 | 776 | −4 |
| 393 | 1110001001 | 905 | 0 | | | |
| 394 | 1110001010 | 906 | 0 | | | |
| 395 | 0110001011 | 395 | 0 | | | |
| 396 | 1110001100 | 908 | 0 | | | |
| 397 | 0110001101 | 397 | 0 | | | |
| 398 | 0110001110 | 398 | 0 | | | |
| 399 | 0110001111 | 399 | 2 | 0110001100 | 396 | −2 |
| 400 | 1110110100 | 948 | 2 | 1100010000 | 784 | −4 |
| 401 | 1110010001 | 913 | 0 | | | |
| 402 | 1110010010 | 914 | 0 | | | |
| 403 | 0110010011 | 403 | 0 | | | |

-continued

Code table

| 9B (decimal) | 10B Binary | Decimal | Operation difference value | 10B Binary | Decimal | Operation difference value |
|---|---|---|---|---|---|---|
| 404 | 1110010100 | 916 | 0 | | | |
| 405 | 0110010101 | 405 | 0 | | | |
| 406 | 0110010110 | 406 | 0 | | | |
| 407 | 0110010111 | 407 | 2 | 0110010100 | 404 | −2 |
| 408 | 1110011000 | 920 | 0 | | | |
| 409 | 0110011001 | 409 | 0 | | | |
| 410 | 0110011010 | 410 | 0 | | | |
| 411 | 0110011011 | 411 | 2 | 0110010010 | 402 | −2 |
| 412 | 0110011100 | 412 | 0 | | | |
| 413 | 0110011101 | 413 | 2 | 0110000011 | 387 | −2 |
| 414 | 0110011110 | 414 | 2 | 0100011001 | 281 | −2 |
| 415 | 1110011101 | 925 | 4 | 0010011010 | 154 | −2 |
| 416 | 1110111000 | 952 | 2 | 0100110000 | 304 | −4 |
| 417 | 1110100001 | 929 | 0 | | | |
| 418 | 1110100010 | 930 | 0 | | | |
| 419 | 0110100011 | 419 | 0 | | | |
| 420 | 1110100100 | 932 | 0 | | | |
| 421 | 0110100101 | 421 | 0 | | | |
| 422 | 0110100110 | 422 | 0 | | | |
| 423 | 0110100111 | 423 | 2 | 0110100100 | 420 | −2 |
| 424 | 1110101000 | 936 | 0 | | | |
| 425 | 0110101001 | 425 | 0 | | | |
| 426 | 0110101010 | 426 | 0 | | | |
| 427 | 0110101011 | 427 | 2 | 0110001010 | 394 | −2 |
| 428 | 0110101100 | 428 | 0 | | | |
| 429 | 0110101101 | 429 | 2 | 0010001101 | 141 | −2 |
| 430 | 0110101110 | 430 | 2 | 0100101001 | 297 | −2 |
| 431 | 1110100111 | 935 | 4 | 0010001110 | 142 | −2 |
| 432 | 1110110000 | 944 | 0 | | | |
| 433 | 0110110001 | 433 | 0 | | | |
| 434 | 0110110010 | 434 | 0 | | | |
| 435 | 0110110011 | 435 | 2 | 0110100010 | 418 | −2 |
| 436 | 0110110100 | 436 | 0 | | | |
| 437 | 0110110101 | 437 | 2 | 0100010101 | 277 | −2 |
| 438 | 0110110110 | 438 | 2 | 1000000110 | 518 | −4 |
| 439 | 0110110111 | 439 | 4 | 0100100110 | 294 | −2 |
| 440 | 0110111000 | 440 | 0 | | | |
| 441 | 0110111001 | 441 | 2 | 1010000001 | 641 | −4 |
| 442 | 0110111010 | 442 | 2 | 1010000010 | 642 | −4 |
| 443 | 0110111011 | 443 | 4 | 0100101010 | 298 | −2 |
| 444 | 0110111100 | 444 | 2 | 1010000100 | 644 | −4 |
| 445 | 0110111101 | 445 | 4 | 0100110001 | 305 | −2 |
| 446 | 1010111110 | 702 | 4 | 0100110010 | 306 | −2 |
| 447 | 1100110111 | 823 | 4 | 1000011010 | 538 | −2 |
| 448 | 0111101010 | 490 | 2 | 0011010000 | 208 | −4 |
| 449 | 0111110001 | 497 | 2 | 0110000001 | 385 | −4 |
| 450 | 0111110010 | 498 | 2 | 0110000010 | 386 | −4 |
| 451 | 0111000011 | 451 | 0 | | | |
| 452 | 0111011100 | 476 | 2 | 0110000100 | 388 | −4 |
| 453 | 0111000101 | 453 | 0 | | | |
| 454 | 0111000110 | 454 | 0 | | | |
| 455 | 0111000111 | 455 | 2 | 0111000100 | 452 | −2 |
| 456 | 0111101100 | 492 | 2 | 0110001000 | 392 | −4 |
| 457 | 0111001001 | 457 | 0 | | | |
| 458 | 0111001010 | 458 | 0 | | | |
| 459 | 0111001011 | 459 | 2 | 0111000010 | 450 | −2 |
| 460 | 0111001100 | 460 | 0 | | | |
| 461 | 0111001101 | 461 | 2 | 0100001101 | 269 | −2 |
| 462 | 0111001110 | 462 | 2 | 0110001001 | 393 | −2 |
| 463 | 1110001111 | 911 | 4 | 0100001110 | 270 | −2 |
| 464 | 0111110100 | 500 | 2 | 0101010000 | 336 | −4 |
| 465 | 0111010001 | 465 | 0 | | | |
| 466 | 0111010010 | 466 | 0 | | | |
| 467 | 0111010011 | 467 | 2 | 0010010011 | 147 | −2 |
| 468 | 0111010100 | 468 | 0 | | | |
| 469 | 0111010101 | 469 | 2 | 0101000101 | 325 | −2 |
| 470 | 0111010110 | 470 | 2 | 0010000110 | 134 | −4 |
| 471 | 0111010111 | 471 | 4 | 0100010110 | 278 | −2 |
| 472 | 0111011000 | 472 | 0 | | | |
| 473 | 0111011001 | 473 | 2 | 1010001001 | 649 | −2 |
| 474 | 0111011010 | 474 | 2 | 0100001010 | 266 | −4 |
| 475 | 0111011011 | 475 | 4 | 0100011010 | 282 | −2 |
| 476 | 0111011110 | 478 | 4 | 0110011000 | 408 | −2 |
| 477 | 0111011101 | 477 | 4 | 0110010001 | 401 | −2 |

-continued

Code table

| 9B (decimal) | 10B Binary | Decimal | Operation difference value | 10B Binary | Decimal | Operation difference value |
|---|---|---|---|---|---|---|
| 478 | 1110011110 | 926 | 4 | 0001011100 | 92 | −2 |
| 479 | 1110010111 | 919 | 4 | 1001001100 | 588 | −2 |
| 480 | 0111111000 | 504 | 2 | 0110010000 | 400 | −4 |
| 481 | 0111100001 | 481 | 0 | | | |
| 482 | 0111100010 | 482 | 0 | | | |
| 483 | 0111100011 | 483 | 2 | 0100010011 | 275 | −2 |
| 484 | 0111100100 | 484 | 0 | | | |
| 485 | 0111100101 | 485 | 2 | 0110000101 | 389 | −2 |
| 486 | 0111100110 | 486 | 2 | 0100000110 | 262 | −4 |
| 487 | 0111100111 | 487 | 4 | 0011000110 | 198 | −2 |
| 488 | 0111101000 | 488 | 0 | | | |
| 489 | 0111101001 | 489 | 2 | 1100001001 | 777 | −2 |
| 490 | 0111101011 | 491 | 4 | 0110101000 | 424 | −2 |
| 491 | 1110101011 | 939 | 4 | 0011001010 | 202 | −2 |
| 492 | 0111101110 | 494 | 4 | 0111001000 | 456 | −2 |
| 493 | 1101101101 | 877 | 4 | 0101100001 | 353 | −2 |
| 494 | 1101101110 | 878 | 4 | 0101001010 | 330 | −2 |
| 495 | 1101001111 | 847 | 4 | 1010001100 | 652 | −2 |
| 496 | 0111110000 | 496 | 0 | | | |
| 497 | 0111111001 | 505 | 4 | 0011110000 | 240 | −2 |
| 498 | 0111111010 | 506 | 4 | 0101110000 | 368 | −2 |
| 499 | 0111110011 | 499 | 4 | 0011010001 | 209 | −2 |
| 500 | 0111110110 | 502 | 4 | 0110110000 | 432 | −2 |
| 501 | 0111101101 | 493 | 4 | 0110100001 | 417 | −2 |
| 502 | 0011111110 | 254 | 4 | 0011010010 | 210 | −2 |
| 503 | 1011100111 | 743 | 4 | 1001010010 | 594 | −2 |
| 504 | 0111111100 | 508 | 4 | 0111010000 | 464 | −2 |
| 505 | 0111110101 | 501 | 4 | 0111000001 | 449 | −2 |
| 506 | 0101111110 | 382 | 4 | 0101010010 | 338 | −2 |
| 507 | 1001111011 | 635 | 4 | 1010010010 | 658 | −2 |
| 508 | 0110111110 | 446 | 4 | 0010011100 | 156 | −2 |
| 509 | 1010111011 | 699 | 4 | 0001110001 | 113 | −2 |
| 510 | 1011011011 | 731 | 4 | 1001010100 | 596 | −2 |
| 511 | 1001110111 | 631 | 4 | 1000110001 | 561 | −2. |

11. The method of claim 10, further comprising calculating a coded operation difference value.

12. The method of claim 11, further comprising:
judging whether the coded operation difference value is greater than a preset value; and
using the 10-bit sequence obtained through complementing a 10-bit codeword as a coding result corresponding to the 9-bit source data when the coded operation difference value is greater than the preset value.

13. The method of claim 10, wherein at least a portion of the 10-bit sequences correspond to unbalanced sequences, wherein the unbalanced sequences have current operation difference values that are not equal to zero, and wherein the Hamming distance detection is performed for each of the unbalanced sequences based at least in part on identifying a minimum Hamming distance.

* * * * *

UNITED STATES PATENT AND TRADEMARK OFFICE
CERTIFICATE OF CORRECTION

PATENT NO. : 8,432,302 B2
APPLICATION NO. : 12/981739
DATED : April 30, 2013
INVENTOR(S) : Dongning Feng et al.

It is certified that error appears in the above-identified patent and that said Letters Patent is hereby corrected as shown below:

In the Claims

Column 30 Line 12 - Claim 1 should read as follows:

1. A convolutional line coding method comprising:
constructing a sequence set, wherein a length of each sequence in the sequence set is n bits, and wherein n is a natural number greater than 1;
determining an operation difference value for each sequence in the sequence set, wherein the operation difference value for each sequence in the set comprises a difference between a number of bits in the sequence having values of 0 and a number of bits in the sequence having values of 1;
identifying balanced sequences in the sequence set, wherein the operation difference value for each of the balanced sequences is equal to zero;
obtaining for each of the balanced sequences source data of n-1 bits corresponding to the balanced sequence;
identifying unbalanced sequences in the sequence set, wherein the operation difference value for each of the unbalanced sequences is not equal to zero;
performing a Hamming distance detection for each of the unbalanced sequences in the sequence set to obtain source data of n-1 bits corresponding to each of the unbalanced sequences, wherein the Hamming distance is calculated between each of the unbalanced sequences and multiple sequences of n-1 bits, and wherein the source data of n-1 bits is selected for each of the unbalanced sequences from the multiple sequences of n-1 bits based at least in part on the source data of n-1 bits and the unbalanced sequence having a minimum Hamming distance;
sorting the balanced sequences and the unbalanced sequences according to the operation difference values;
generating a code table, wherein the code table comprises a number of entries, wherein each entry identifies one of the sequences of n bits and its corresponding source data of n-1 bits; and
obtaining a coding result comprising one of the sequences of n bits according to a mapping relation in the code table.

Signed and Sealed this
Twenty-fifth Day of June, 2013

Teresa Stanek Rea
*Acting Director of the United States Patent and Trademark Office*